US008080767B2

(12) United States Patent
Yamaga et al.

(10) Patent No.: US 8,080,767 B2
(45) Date of Patent: Dec. 20, 2011

(54) THERMAL PROCESSING APPARATUS AND THERMAL PROCESSING METHOD FOR OBJECT TO BE PROCESSED

(75) Inventors: Kenichi Yamaga, Nirasaki (JP); Wenling Wang, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 12/481,754

(22) Filed: Jun. 10, 2009

(65) Prior Publication Data
US 2009/0311807 A1    Dec. 17, 2009

(30) Foreign Application Priority Data

Jun. 11, 2008 (JP) .................................. 2008-153552

(51) Int. Cl.
*F27B 5/18*     (2006.01)
*F27D 19/00*    (2006.01)
*G01K 1/14*     (2006.01)
*G01K 7/32*     (2006.01)
*H01L 21/02*    (2006.01)
*H01L 21/66*    (2006.01)

(52) U.S. Cl. ........ 219/441; 219/411; 219/494; 219/486; 118/50.1; 118/725; 374/117; 374/120

(58) Field of Classification Search ........................ None
See application file for complete search history.

(56) References Cited

U.S. PATENT DOCUMENTS

| | | | | |
|---|---|---|---|---|
| 3,519,924 A | * | 7/1970 | Burton | .......................... 324/71.1 |
| 6,144,332 A | * | 11/2000 | Reindl et al. | .................... 342/42 |
| 7,896,544 B2 | * | 3/2011 | Nagashima et al. | .......... 374/176 |
| 2006/0203877 A1 | * | 9/2006 | Heyman et al. | ................ 374/117 |
| 2007/0051176 A1 | * | 3/2007 | Liu | .................................. 73/579 |
| 2007/0170170 A1 | * | 7/2007 | Sata et al. | ..................... 219/497 |

FOREIGN PATENT DOCUMENTS

| | | | |
|---|---|---|---|
| JP | 07012654 A | * | 1/1995 |
| JP | 10-25577 | | 1/1998 |

(Continued)

OTHER PUBLICATIONS

Hornsteiner et al., "Surface Acoustic Wave Sensors for High Temperature Applications," 1998 IEEE INternational Frequency Control Symposium, pp. 615-620.*

(Continued)

*Primary Examiner* — Joseph M Pelham
(74) *Attorney, Agent, or Firm* — Smith, Gambrell & Russell, LLP

(57) ABSTRACT

A thermal processing apparatus comprising a processing vessel containing, in addition to a plurality of objects subject to heat treatment, an acoustic wave device for temperature measurement. A holding unit holds the plurality of objects to be processed and an object for temperature measurement utilizing an acoustic wave device. A heating unit heats the objects to be processed and the object for temperature measurement. A first conductive member functions as an antenna for transmitting an electromagnetic wave toward the acoustic wave device in the processing vessel; a second conductive member functions as a receiver antenna for receiving an electromagnetic wave dependent on a temperature of the acoustic wave device which is emitted from the acoustic wave device. A temperature analysis part obtains a temperature of the object based on the electromagnetic wave received by the receiver antenna, and a temperature control part controls the heating unit. The first and second conductive members are each part of the thermal processing parts in the processing vessel.

40 Claims, 11 Drawing Sheets

<FIRST EMBODIMENT>

FOREIGN PATENT DOCUMENTS

| | | |
|---|---|---|
| JP | 2000-77346 | 3/2000 |
| JP | 2004-140167 | 5/2004 |
| JP | 2004150860 A * | 5/2004 |
| JP | 2004347451 A * | 12/2004 |
| JP | 2007-171047 | 7/2007 |

OTHER PUBLICATIONS

Honal et al., "Langasite Surface Acoustic Wave Sensors for High Temperatures," 2000 International Frequency Control Symposium and Exhibition, pp. 113-118.*

* cited by examiner

<SECOND EMBODIMENT>

<FIRST MODIFICATION>

<SECOND MODIFICATION>

THERMAL PROCESSING APPARATUS AND THERMAL PROCESSING METHOD FOR OBJECT TO BE PROCESSED

TECHNICAL FIELD

The present invention relates to a thermal processing apparatus and a thermal processing method for thermally processing an object to be processed such as a semiconductor wafer.

BACKGROUND ART

When a semiconductor integrated circuit such as an IC is manufactured, a semiconductor wafer formed of a silicon substrate or the like is generally, repeatedly subjected to various processes such as a film deposition process, an etching process, an oxidation-and-diffusion process, and an annealing process. When a thermal process typified by a film deposition process is performed to a semiconductor, one of important factors is a temperature regulation (management) for a wafer. Namely, in order to increase a film deposition rate of a film to be formed on a wafer surface and/or in order to achieve an interfilm uniformity and an in-plane uniformity with respect to thickness of the film, it is required to regulate (control) a temperature of the wafer with a high precision.

Given herein as an example to describe the temperature regulation is a case where a vertical thermal processing apparatus capable of simultaneously processing a plurality of wafers is used as a thermal processing apparatus. At first, semiconductor wafers supported in a tier-like manner are loaded into a vertical processing vessel, and the wafers are heated by a heating unit disposed on an outer circumference of the processing vessel so that temperatures of the wafers are raised. Then, after the temperatures have been stabilized, a film deposition gas is caused to flow, whereby a film deposition process is performed. In this case, a thermocouple is disposed inside and/or outside the processing vessel, so that a power of the heating unit is controlled based on a temperature obtained from the thermocouple, to maintain the temperatures of the wafers at a predetermined temperature (for example, JP10-25577A and JP2000-77346A).

When the processing vessel has a vertical length enough to receive therein about 50 to 150 wafers, in order to achieve a desired minute (precise) temperature control in the processing vessel, it is preferable to vertically divide the inside space of the processing vessel into a plurality of heating zones and to independently control a temperature of each heating zone. Herein, if a thermocouple is disposed on an experimental dummy wafer itself, a correlation between an actual temperature of the dummy wafer detected by this thermocouple and a temperature detected by another thermocouple disposed inside and/or outside the processing vessel can be previously obtained by an experiment. In this case, by referring to the correlation, there can be realized a proper temperature control for a product wafer when the product wafer is thermally processed.

In addition, in order to measure a temperature distribution of a semiconductor wafer during a thermal process, there has been proposed the following technique (JP2007-171047A). Namely, a plurality of temperature sensors, each having a surface elastic wave (acoustic wave) device, are dispersedly arranged on a surface of a wafer. Radiofrequency signals are transmitted to the respective temperature sensors from a separate antenna that is additionally installed. In response to the radiofrequency signals, the temperature sensors respectively send back second (returned) radiofrequency signals dependent on respective temperatures of the temperature sensors. By receiving and analyzing the (second) radiofrequency signals, a temperature distribution can be obtained (JP2007-171047A).

In the temperature control method for the thermal processing apparatus as disclosed in JP10-25577A and JP2000-77346A, since the thermocouple is not in direct contact with the wafer whose temperature is to be measured, the correlation between an actual temperature of the wafer (product wafer) and a value measured by the thermocouple is not constant at every moment. In particular, there is a possibility that the temperature of the wafer may not be properly controlled when the actual correlation for the product wafer is largely deviated from the previously obtained correlation for the dummy wafer. For example, this deviation may be caused by unnecessary deposits adhering to an inner wall surface of the processing vessel and the like because of repeated film deposition processes, by any change of a gas flow rate and/or a process pressure, and by a voltage variation.

On the other hand, even when a temperature of a wafer is increased and decreased, there is also a demand for controlling the temperature of the wafer. However, it is difficult for the aforementioned method using a thermocouple to meet this demand, because the difference between an actual temperature of the wafer and a value measured by the thermocouple tends to become larger and fluctuate, when the temperature of the wafer is to be increased and decreased.

In order to solve this problem, it can be considered that a thermocouple is disposed on the wafer itself. However, since wires have to be connected to the thermocouple, it is difficult for the thermocouple to follow the wafer when it is rotated and transferred. Further, a metal contamination may be caused by the thermocouple.

As disclosed in JP2004-140167A, in a single-wafer type of processing apparatus, the use of a quartz oscillator can be considered so as to obtain a wafer temperature by receiving an electromagnetic wave dependent on the wafer temperature. However, a heating resistance of quartz is about 300° C. at most. Thus, such measures cannot be applied to a thermal processing apparatus in which a higher temperature process is performed.

Further, in the technique disclosed in JP 2004-140167A, it is necessary to additionally dispose an antenna itself. The antenna has to be disposed in a chamber. Thus, there may be generated a metal contamination for a semiconductor wafer.

SUMMARY OF THE INVENTION

In view of the above problems, the present invention has been made so as to efficiently solve the same. The object of the present invention is to provide a thermal processing apparatus and a thermal processing method for an object to be processed, capable of detecting a temperature of the object to be processed with a high precision in a wireless and real-time manner, to thereby perform a temperature control of the object to be processed with a high precision, without providing any additional separate antenna and without causing any metal contamination.

The inventors of the present invention have conducted extensive studies about a temperature measurement of a semiconductor wafer, and found that an elastic wave device made of langasite or lanthanum tantalic acid gallium aluminium will generate an electric wave (second electric wave) dependent on a temperature thereof based on another original elastic wave generated by an original electrical stimulation thereto. The present invention has been made by applying this knowledge to measurement of a wafer temperature, and by using a conductive material, such as a resistance heater, as an antenna.

The present invention is a thermal processing apparatus comprising: a processing vessel capable of being evacuated, the processing vessel also being capable of accommodating, in addition to a plurality of objects to be processed, an object for temperature measurement equipped with an elastic wave device; a holding unit configured to be loaded into and unloaded from the processing vessel, while the holding unit holding the plurality of objects to be processed and the object for temperature measurement; a gas introduction unit configured to introduce a gas into the processing vessel; a heating unit configured to heat the plurality of objects to be processed and the object for temperature measurement that are accommodated in the processing vessel; a first conductive member configured to function as a transmitter antenna connected to a transmitter through a radiofrequency line, for transmitting an electric wave for measurement toward the elastic wave device accommodated in the processing vessel; a second conductive member configured to function as a receiver antenna connected to a receiver through a radiofrequency line, for receiving an electric wave dependent on a temperature of the elastic wave device which is emitted from the elastic wave device accommodated in the processing vessel; temperature analysis part configured to obtain a temperature of the object for temperature measurement based on the electric wave received by the receiver antenna; and a temperature control part configured to control the heating unit; wherein: the first conductive member is disposed as a part of a thermal processing part in the processing vessel; and the second conductive member is disposed as a part of a thermal processing part in the processing vessel.

In this manner, since the first conductive member and the second conductive member, which are respectively a part of the thermal processing part in the thermal processing apparatus, are caused to function as (also used as) the transmitter antenna and the receiver antenna, when it is required to obtain a temperature, with the use of the elastic wave device formed of a langasite substrate device or an LTGA substrate device, by receiving an electric wave emitted from the elastic wave device, it is not necessary to additionally install a transmitter-receiver antenna. Thus, the temperature of the object for temperature measurement (this temperature can be regarded as temperatures of the objects to be processed) can be detected with a high precision in a wireless and substantially real time manner, without generating a metal contamination or the like. As a result, a highly precise temperature control can be performed.

In addition, by this direct temperature measuring method, even when temperatures of the objects to be processed are increased or decreased, a temperature increase speed or a temperature decrease speed, for example, can be accurately controlled. Namely, a control of temperature increase and temperature decrease can be properly performed. In addition, even when a film adheres to an inner wall surface of the processing vessel, the temperatures of the objects to be processed can be accurately obtained.

Preferably, the radiofrequency line is provided with a radiofrequency filter part that transmits a radiofrequency component but cuts a low frequency component and a direct-current component.

In addition, preferably, the heating unit includes a heating power source and a resistance heater connected to the heating power source through a feeder line.

In this case, preferably, the resistance heater is divided into a plurality of zone heaters to which powers can be individually, controllably supplied, in order to separate an inside space of the processing vessel into a plurality of heating zones. In this case, for example, each adjacent two zone heaters are in an electrically conductive state, and a feeder line is connected to each of the zone heaters. Alternatively, each adjacent two zone heaters are in an electrically insulated state, and a feeder line is connected to each of the zone heaters.

In addition, preferably, the first conductive member and/or the second conductive member are/is the resistance heater.

In addition, preferably, the feeder line is provided with a power filter part that transmits a heating-power component but cuts a radiofrequency component.

In this case, preferably, the temperature control part is configured to deliver a heating power to be supplied to the resistance heater and a power for an electric wave for measurement to be emitted from the transmitter in a periodically divided manner.

In addition, for example, the holding unit is made of a conductive material and the first conductive member and/or the second conductive member are/is the holding unit. Alternatively, for example, the gas introduction unit is made of a conductive material, and the first conductive member and/or the second conductive member are/is the gas introduction unit.

In these cases, preferably, the first conductive member and/or the second conductive member are/is made of a semi-conducting material. For example, the semiconducting material is one material that is selected from a group consisting of polysilicon, single crystal silicon, SiC, SiGe, GaN, ZnO, AlN, and GaAs.

Alternatively, the present invention is a thermal processing apparatus comprising: a processing vessel capable of being evacuated, the processing vessel also being capable of accommodating, in addition to a plurality of objects to be processed, an object for temperature measurement equipped with an elastic wave device; a holding unit configured to be loaded into and unloaded from the processing vessel, while the holding unit holding the plurality of objects to be processed and the object for temperature measurement; a gas introduction unit configured to introduce a gas into the processing vessel; a heating unit configured to heat the plurality of objects to be processed and the object for temperature measurement that are accommodated in the processing vessel; a first conductive member configured to function as a transmitter antenna connected to a transmitter through a radiofrequency line, for transmitting an electric wave for measurement toward the elastic wave device accommodated in the processing vessel; a second conductive member configured to function as a receiver antenna connected to a receiver through a radiofrequency line, for receiving an electric wave dependent on a temperature of the elastic wave device which is emitted from the elastic wave device accommodated in the processing vessel; a temperature analysis part configured to obtain a temperature of the object for temperature measurement based on the electric wave received by the receiver antenna; a temperature control part configured to control the heating unit; and a temperature measuring unit disposed in the processing vessel and/or on the heating unit; wherein: the first conductive member is disposed as a part of the temperature measuring unit; and the second conductive member is disposed as a part of the temperature measuring unit.

In this manner, since the first conductive member and the second conductive member, which are respectively a part of the thermal processing part in the thermal processing apparatus, are caused to function as (also used as) the transmitter antenna and the receiver antenna, when it is required to obtain a temperature, with the use of the elastic wave device formed of a langasite substrate device or an LTGA substrate device, by receiving an electric wave emitted from the elastic wave device, it is not necessary to additionally install a transmitter-receiver antenna. Thus, the temperature of the object for temperature measurement (this temperature can be regarded as temperatures of the objects to be processed) can be detected with a high precision in a wireless and substantially real time manner, without generating a metal contamination or the like. As a result, a highly precise temperature control can be performed.

In addition, by this direct temperature measuring method, even when temperatures of the objects to be processed are increased or decreased, a temperature increase speed or a temperature decrease speed, for example, can be accurately controlled. Namely, a control of temperature increase and temperature decrease can be properly performed. In addition, even when a film adheres to an inner wall surface of the processing vessel, the temperatures of the objects to be processed can be accurately obtained.

Preferably, the radiofrequency line is provided with a radiofrequency filter part that transmits a radiofrequency component but cuts a low frequency component and a direct-current component.

In addition, preferably, the heating unit includes a heating power source and a resistance heater connected to the heating power source through a feeder line.

In this case, preferably, the resistance heater is divided into a plurality of zone heaters to which powers can be individually, controllably supplied, in order to separate an inside space of the processing vessel into a plurality of heating zones. In this case, for example, each adjacent two zone heaters are in an electrically conductive state, and a feeder line is connected to each of the zone heaters. Alternatively, each adjacent two zone heaters are in an electrically insulated state, and a feeder line is connected to each of the zone heaters.

In addition, preferably, the feeder line is provided with a power filter part that transmits a heating-power component but cuts a radiofrequency component.

In addition, preferably, the temperature measuring unit includes a thermocouple, and the first conductive member and/or the second conductive member are/is the thermocouple.

In this case, preferably, a thermocouple line connected to the thermocouple is provided with a direct-current filter part that transmits a direct-current component but cuts a radiofrequency component.

Alternatively, preferably, the temperature measuring unit includes a protective tube made of a conductive material, for accommodating the thermocouple to protect the same, and the first conductive member and/or the second conductive member are/is the protective tube.

In these cases, preferably, the first conductive member and/or the second conductive member are made of a semi-conducting material.

For example, the semiconducting material is one material that is selected from a group consisting of polysilicon, single crystal silicon, SiC, SiGe, GaN, ZnO, AlN, and GaAs.

In addition, in the aforementioned respective inventions, preferably, a plurality of elastic wave devices are disposed on the object for temperature measurement, and frequency bands of the elastic wave devices are set differently from each other.

In this case, for example, the elastic wave devices are disposed on the object for temperature measurement at least at a central portion thereof and at a peripheral portion thereof.

Alternatively, in the aforementioned respective inventions, preferably, the object for temperature measurement comprises a plurality of objects for temperature measurement that are arranged correspondingly to the respective heating zones.

In addition, in the aforementioned respective inventions, preferably, frequency bands of the elastic wave devices of the objects for temperature measurement are set differently from each other for the respective heating zones.

In addition, in the aforementioned respective inventions, preferably, the first conductive member and the second conductive member are integrated to each other, so that a function of the transmitter antenna and a function of the receiver antenna are integrated to each other as a function of a transmitter-receiver antenna.

In addition, in the aforementioned respective inventions, it is preferable that the processing vessel is provided with a plasma generating unit configured to generate a plasma by a radiofrequency power so as to assist a thermal process to the objects to be processed, and a frequency band of the electric wave for measurement is set differently from a frequency of the radiofrequency power.

Alternatively, in the aforementioned respective inventions, it is preferable that the processing vessel is provided with a plasma generating unit configured to generate a plasma by a radiofrequency power so as to assist a thermal process to the objects to be processed; and when the electric wave for measurement is transmitted and received, generation of plasma is temporarily suspended.

It is preferable that the elastic wave device is selected from a surface elastic wave device, a bulk elastic wave device, and a boundary elastic wave device.

For example, the elastic wave device is a substrate device made of one material that is selected from a group consisting of lanthanum tantalic acid gallium aluminium (LTGA), quartz ($SiO_2$), zinc oxide (ZnO), Rochelle salt (sodium potassium tartrate: $KNaC_4H_4O_5$), lead zirconate titanate (PZT: $pb(Zr, Ti)O_3$), lithium niobate ($LiNbO_3$), lithium tantalum acid ($LiTaO_3$), lithium tetraborate ($Li_2B_4O_7$), langasite ($La_3Ga_5SiO_{14}$), aluminium nitride, tourmaline, and poly vinylidene fluoride (PVDF).

In addition, preferably, the temperature control part controls the heating unit based on one of an output from the temperature analysis part, an output from the temperature measuring unit, and an output from a previously stored thermal model, or a combination thereof.

In addition, it is preferable that the thermal processing apparatus further comprises a storage part configured to store an output from the temperature analysis part. In addition, it is preferable that the thermal processing apparatus further comprises a displaying part configured to display an output from the temperature analysis part.

Alternatively, the present invention is a thermal processing method for an object to be processed in which a holding unit holding an object for temperature measurement equipped with an elastic wave device and a plurality of objects to be processed is loaded into a processing vessel, and the objects to be processed are heated by a heating unit so as to be thermally processed, the thermal processing method comprising: transmitting an electric wave for measurement from a transmitter antenna disposed on the processing vessel to the object for temperature measurement; receiving an electric wave emitted by the elastic wave device of the object for temperature measurement after the elastic wave device has received the electric wave for measurement, by an receiver antenna disposed on the processing vessel; obtaining a temperature of the object for temperature measurement based on the electric wave received by the receiver antenna; and controlling the heating unit based on the obtained temperature.

Preferably, an inside space of the processing vessel is divided into a plurality of heating zones, the object for temperature measurement comprises a plurality of objects for temperature measurement that are arranged correspondingly to the respective heating zones, and frequency bands of the elastic wave devices of the objects for temperature measurement are set differently from each other.

In addition, preferably, a thermocouple for temperature measurement is disposed in the processing vessel and/or on the heating unit, when the heating unit is controlled, the heating unit is controlled by referring not only to the measured temperature of the object for temperature measurement but also to a temperature value measured by the thermocouple.

In addition, preferably, the thermal processing method further comprises processing the objects to be processed by a plasma generated by a radiofrequency power so as to assist the thermal process to the objects to be processed, wherein a frequency band of the electric wave for measurement is set differently from a frequency of the radiofrequency power.

Alternatively, the present invention is a storage medium storing a computer program executable on a computer, wherein the computer program incorporates steps for performing the thermal processing method having the aforementioned features.

BEST MODE FOR CARRYING OUT THE INVENTION

With reference to the attached drawings, there are described herebelow embodiments of the thermal processing apparatus and the thermal processing method for an object to be processed according to the present invention.

First Embodiment

Figure 1:
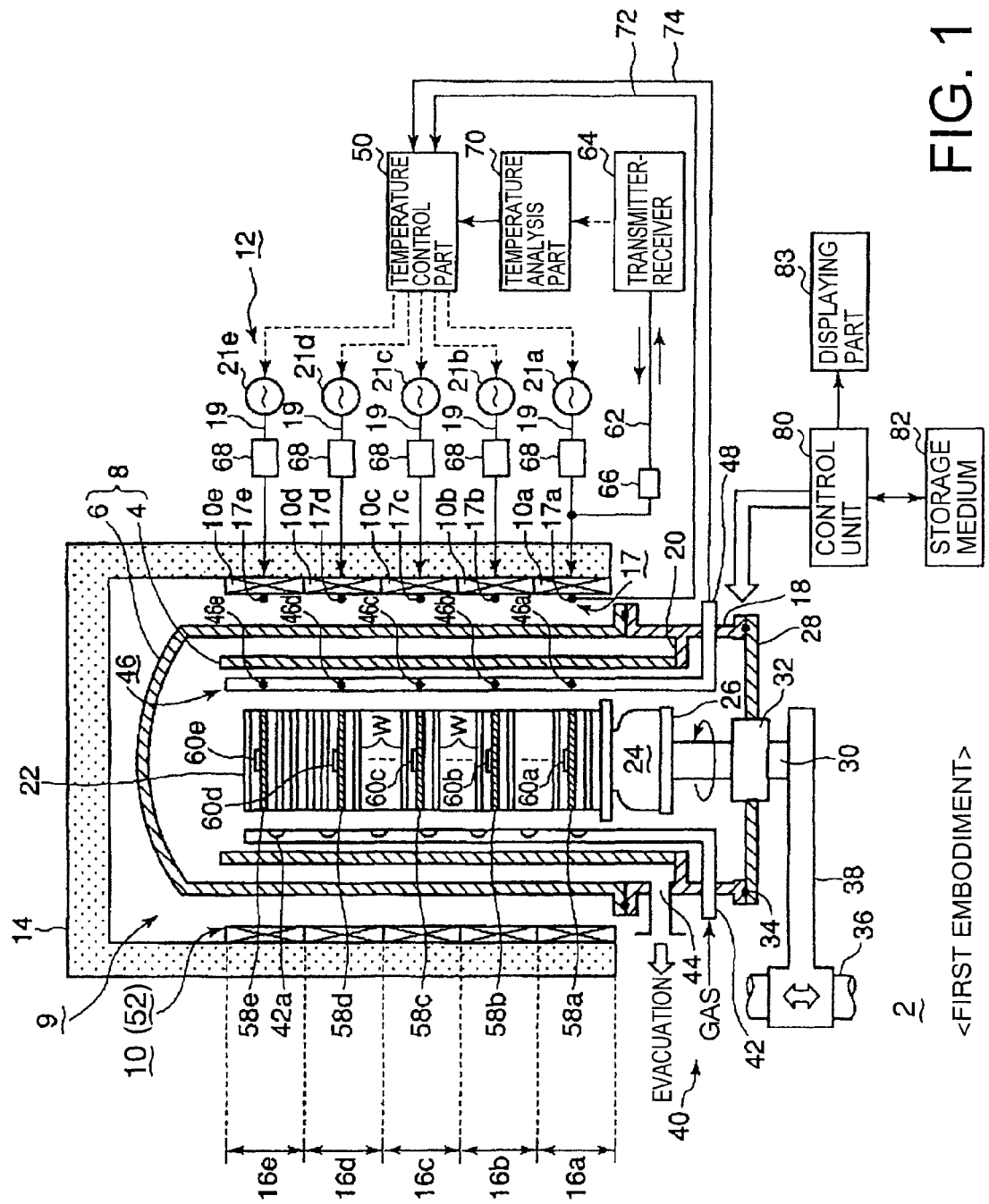
FIG. 1 is a sectional structural view showing a first embodiment of a thermal processing apparatus according to the present invention.
Figure 2A:
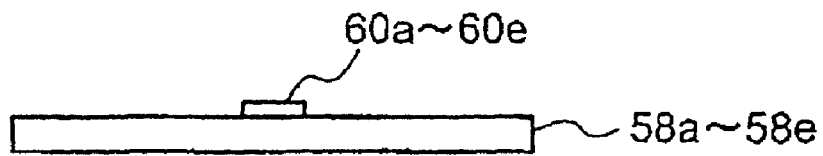
FIGS. 2A to 2C are views for explaining objects for temperature measurement, each object being provided with an elastic wave device.
Figure 2B:
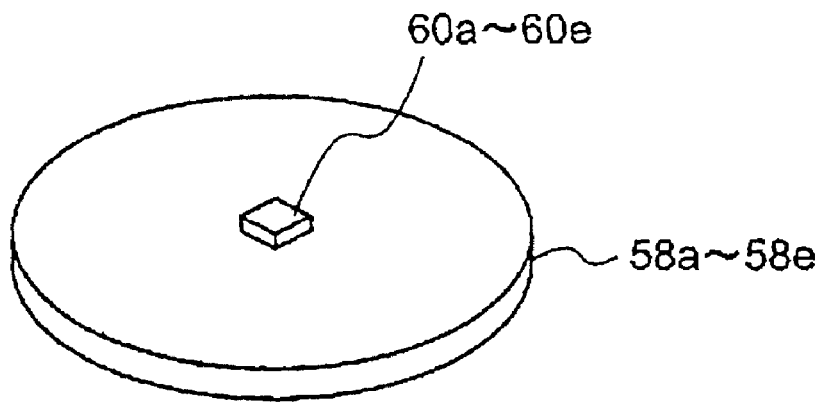
Figure 2C:
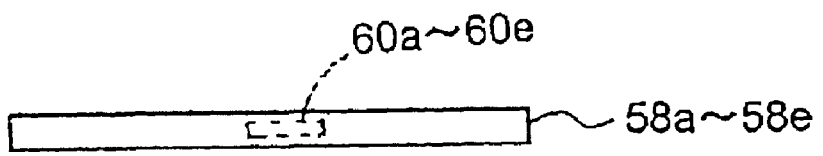
Figure 3:
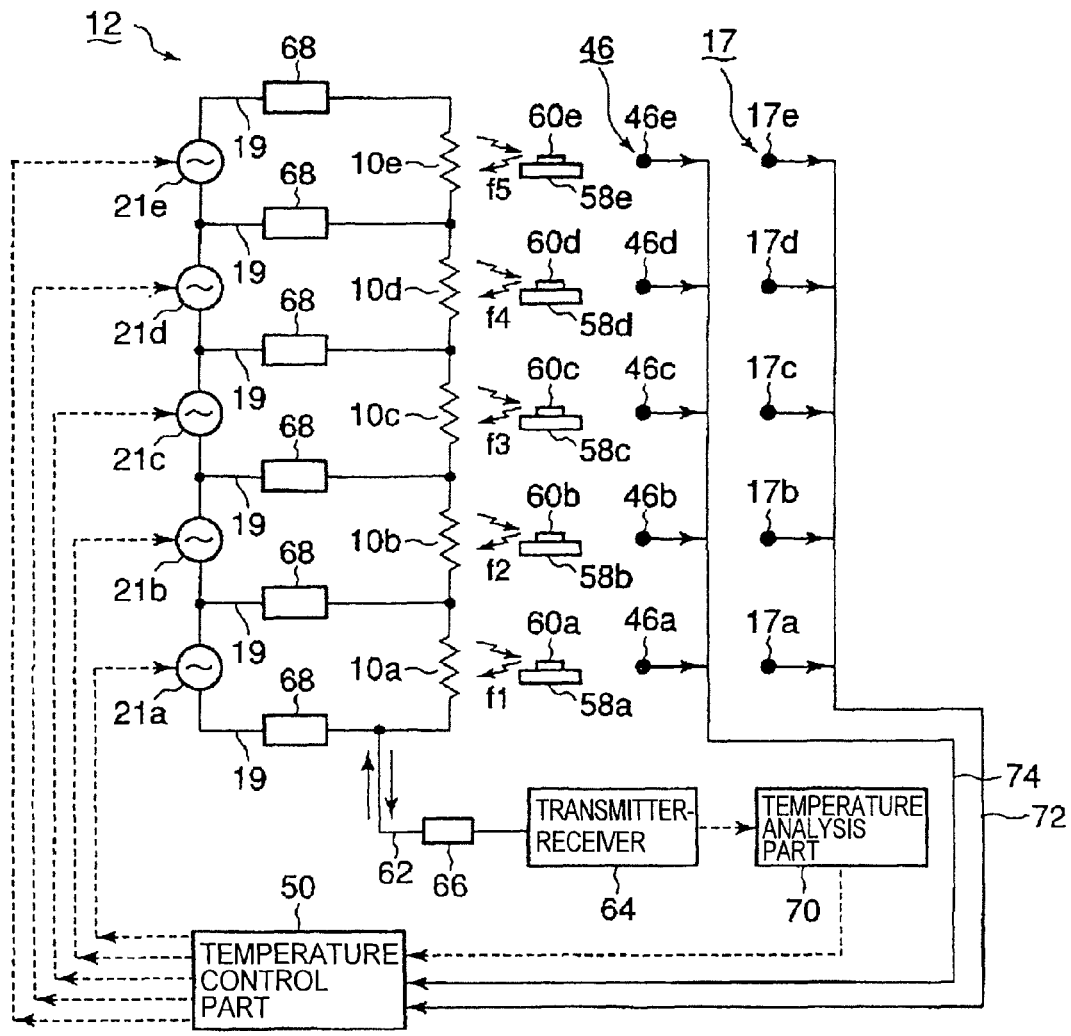
FIG. 3 is a system view showing a temperature control system of the thermal processing apparatus.
Figure 4:
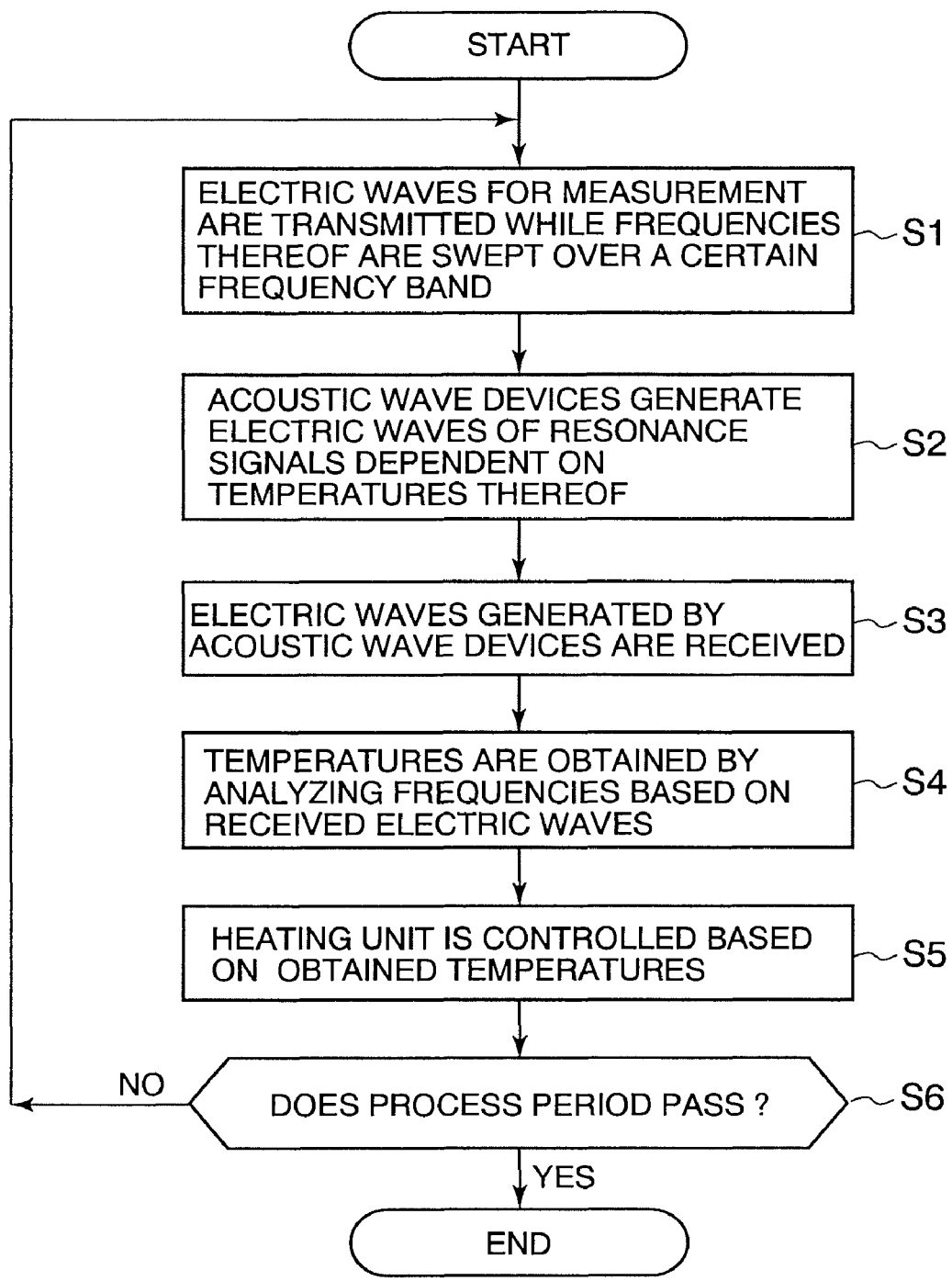
FIG. 4 is a flowchart showing an example of a thermal processing method according to the present invention.
Figure 5A:
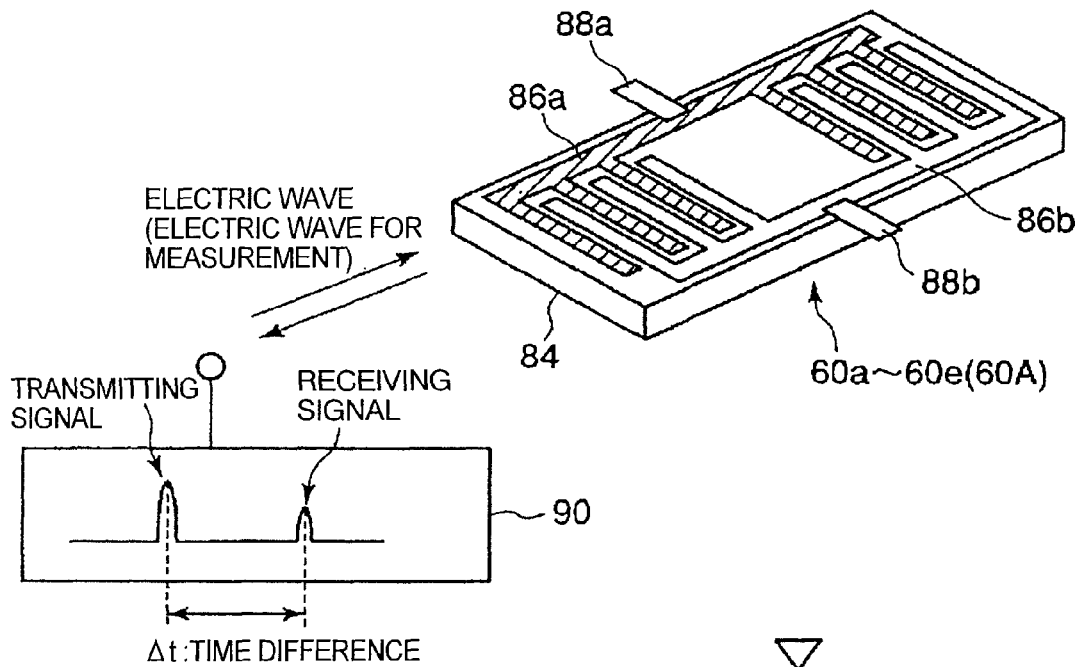
FIGS. 5A and 5B are operational principle views for explaining operational principles of elastic wave devices.
Figure 5B:
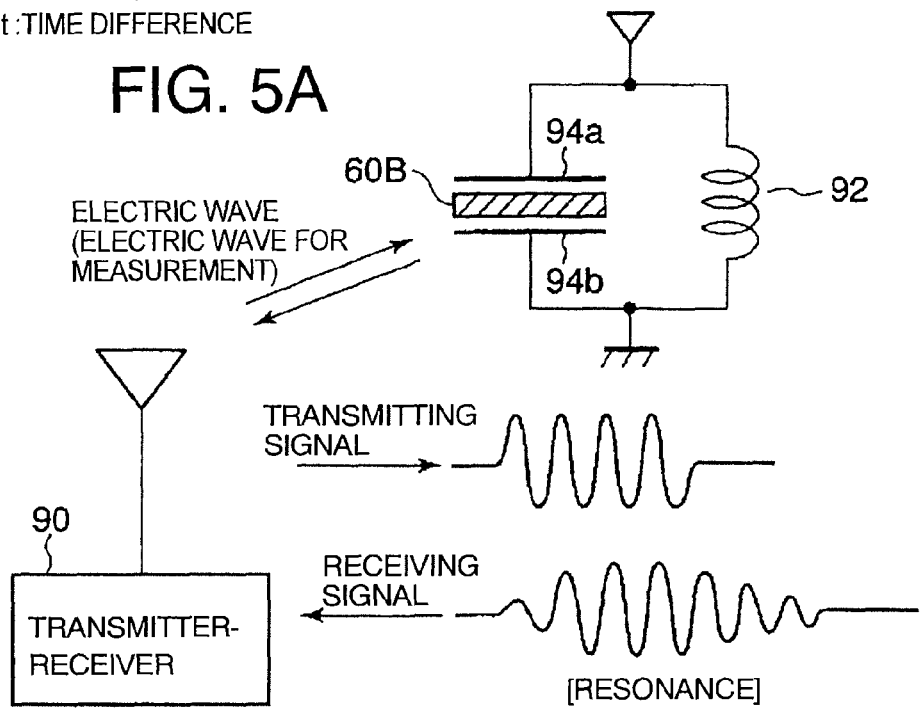

FIG. 1 is a sectional structural view showing a first embodiment of a thermal processing apparatus according to the present invention. FIGS. 2A to 2C are views for explaining objects for temperature measurement, each object being provided with an elastic wave device. FIG. 3 is a system view showing a temperature control system of the thermal processing apparatus. FIG. 4 is a flowchart showing an example of a thermal processing method according to the present invention. FIGS. 5A and 5B are operational principle views for explaining operational principles of elastic wave devices. Given herein as an example to describe the present invention is a case where a transmitter antenna and a receiver antenna are united with each other so as to provide a transmitter-receiver antenna. In addition, there is described a vertical thermal processing apparatus by way of example.

As shown in FIG. 1, a thermal processing apparatus 2 in this embodiment includes a processing vessel 8 of a dual-tube structure having a tubular quartz inner tube 4 and a tubular quartz outer tube 6, which has a ceiling and is disposed concentrically outside the inner tube 4. An outer circumference of the processing vessel 8 is covered with a heating unit 12 having a resistance heater 10. Thus, objects to be processed accommodated in the processing vessel 8 can be heated. The processing vessel 8 (including an inside thereof) and the heating unit 12 constitute a thermal processing part 9.

The heating unit 12 has a cylindrical shape, and is disposed to surround substantially all the area of a side surface of the processing vessel 8. In addition, a heat-insulation member 14 is disposed on the outer circumference of the processing vessel 8 so as to cover all the ceiling part and the side surface of the processing vessel 8. The heating unit 12 is fixed to an inside surface of the heat-insulation member 14. The resistance heater 10 is formed of a conductive member. The resistance heater 10 also has a function of a transmitter antenna and a function of a receiver antenna, which will be described hereinafter.

A heating region of the processing vessel 8 is divided into a plurality of, e.g., five heating zones 16a, 16b, 16c, 16d, and 16e, in a height direction. Correspondingly to the respective heating zones 16a to 16e, the resistance heater 10 of the heating unit 12 is separated into five zone heaters 10a, 10b, 10c, 10d, and 10e, which can be individually controlled. The number of the heating zones is not particularly limited. The zone heaters 10a to 10e in this embodiment are in a conductive state by electrically connecting each adjacent two heating zones.

Feeder lines 19 are extended to the respective zone heaters 10a to 10e. Heating power sources 21a, 21b, 21c, 21d, and 21e are connected to the respective feeder lines 19. The zone heaters 10a to 10e, the feeder lines 19, and the heating power sources 21a to 21e constitute the heating unit 12. The heating power sources 21a to 21e include switching elements such as thyristors or the like. Thus, output powers of the respective heating power sources 21a to 21b can be individually controlled in accordance with a phase control or a zero-cross control. In order to measure temperatures of the zone heaters 10a to 10e, the zone heaters 10a to 10e are respectively provided with heater thermocouples 17a to 17e as a first temperature measuring unit 17.

A lower end of the processing vessel 8 is supported by a tubular manifold 18 made of stainless steel, for example. A lower end of the inner tube 4 is supported by a support ring 20 fixed to an inner wall of the manifold 18. The manifold 18 may be made of quartz or the like, or may be integrally formed with the processing vessel 8.

In addition, there is provided a quartz wafer boat 22 as a holding unit, in which a plurality of objects to be processed such as semiconductor wafers W can be placed. The wafer boat 22 can be moved vertically so as to be loaded into and unloaded from the manifold 18 from below. As the semiconductor wafer W, there is used a 300-mm wafer, for example, although the size of the wafer is not particularly limited.

The wafer boat 22 is placed on a rotational table 26 via a quartz heat-retention tube 24. The rotational table 26 is supported on an upper end of a rotational shaft 30 passing through a lid part 28, which opens and closes the lower opening of the manifold 18. The part of the lid member 28 through which the rotational shaft 30 passes is equipped with a magnetic fluid seal 32. Thus, the rotational shaft 30 can be rotated while maintaining the hermetically sealed state of the vessel 8. In addition, disposed between a peripheral part of the lid part 28 and the lower end of the manifold 18 is a seal member 34 formed of, e.g., an O-ring. Thus, a sealing property of the vessel can be secured.

The rotational shaft 30 is fixed on a distal end of an arm 38 supported by an elevating mechanism 36 such as a boat elevator, so that the rotational shaft 30 can elevate and lower the wafer boat 22 and the lid part 28 all together.

A gas introduction unit 40 is disposed on a side part of the manifold 18. To be specific, the gas introduction unit 40 includes a gas nozzle 42 passing through the manifold 18, and can supply a required gas while a flow rate thereof being controlled. The gas nozzle 42 is made of, e.g., quartz, and is extended in a longitudinal direction, i.e., a height direction of the processing vessel 8 so as to cover all the height of the wafer boat 22.

The gas nozzle 42 is provided with a number of gas holes 42a at equal pitches therebetween, for example, so that the gas can be ejected from these gas holes 42a. Herein, although the one gas nozzle 42 is illustrated as a representative, a plurality of gas nozzles are actually disposed in accordance with the kinds of gases to be used. An outlet port 44 is formed in a side wall of the manifold 18 from which an atmosphere in the processing vessel 8 is discharged outside through a space between the inner tuber 4 and the outer tube 6. Connected to the outlet port 44 is a vacuum exhaust system (not shown) including, e.g., a vacuum pump and a pressure adjusting valve, not shown.

Between the inner tube 4 and the wafer boat 22, there are disposed five inside thermocouples 46a to 46e as a second temperature measuring unit 46, correspondingly to the zone heaters 10a to 10e. The inside thermocouples 46a to 46e are accommodated in a common protective tube 48 made of, e.g., quartz. A lower end of the protective tube 48 is bent so as to pass through the manifold 18.

Values (signals) detected by the respective thermocouples 17a to 17d and 46a to 46e are inputted to a temperature control part 50 formed of, e.g., a computer. As described below, during a thermal process, powers to be supplied to the respective zone heaters 10a to 10e of the heating unit 12 are individually controlled based on the detected values.

As described above, the resistance heater 10, which is a constituent element of the heating unit 12, is configured to function as a transmitter-receiver antenna 52, which is a characteristic feature of the present invention. The resistance heater 10 is generally made of conductive material such as alloy such as Cr—Fe—Al, molybdenum silicide, and carbon wire. By supplying a radiofrequency current to such a resistance heater 10, an electric wave can be radiated. Thus, the resistance heater 10 can be used as the transmitter-receiver antenna 52.

In this embodiment, in addition to the semiconductor wafers W as product wafers, the wafer boat 22 also holds a dummy wafer and a wafer for temperature measurement, which is an object for temperature measurement including an elastic wave device (acoustic wave device), which is a characteristic feature of the present invention. As the elastic wave device, either of a surface elastic wave device or a bulk elastic wave device may be used. Specifically, correspondingly to the respective zone heaters 10a to 10e, there are held five wafers for temperature measurement 58a, 58b, 58c, 58d, and 58e. The respective wafers for temperature measurement 58a to 58e are held on positions which are best suitable for controlling the zone heaters 10a to 10e. It is set that electric waves from the transmitter-receiver antenna 52 serving also as the resistance heater 10 can reach the wafers for temperature measurement 58a to 58e.

Elastic wave devices 60a, 60b, 60c, 60d, and 60e are respectively disposed on the wafers for temperature measurement 58a to 58e (see, FIGS. 2A and 2B). When electric waves are emitted from the transmitter-receiver antenna 52 to the respective elastic wave devices 60a to 60e, the elastic wave devices 60a to 60e are configured to send back (second) electric waves dependent on temperatures thereof to the transmitter-receiver antenna 52. FIG. 2A is a side view of the wafer for temperature measurement in this example, and FIG. 2B is a perspective view thereof.

However, as shown in FIG. 2C, there may be employed another example in which the elastic wave devices 60a to 60e are embedded in the wafers for temperature measurement 58a to 58e, respectively. In this case, the embedding method is not particularly limited. Namely, each of the elastic wave devices 60a to 60e may be embedded by sandwiching the same between two very thin wafer members. Alternatively, an embedment hole may be formed in a surface of the wafer for temperature measurement, and the elastic surface wave device is accommodated in the hole to be embedded.

Regarding the elastic wave devices 60a to 60e, a langasite substrate device using langasite ($La_3Ga_5SiOI_4$) may be used as a surface elastic wave device. Alternatively, lanthanum tantalic acid gallium aluminium (hereinafter also referred to as "LTGA") substrate device may be used as a bulk elastic wave device. In both the cases, radiofrequency bands of the elastic wave devices 60a to 60e for the respective heating zones are preferably set differently from each other, in order to prevent an electrical interference therebetween.

With reference to FIG. 3, there is described a temperature control system in which the resistance heater 10 is also used as the transmitter-receiver antenna 52. As shown in FIG. 3, the zone heaters 10a to 10e corresponding to the heating zones 16a to 16e (see FIG. 1) are connected in a conductive state (in a serial manner), and the feeder lines 19 are drawn out from their junction points and their uppermost point and their lowermost point. Heating power sources 21a to 21e are connected at positions between the adjacent feeder lines 19. Thus, heating powers (powers for heater) can be individually, controllably supplied to the zone heaters 10a to 10e corresponding to the heating zones 16a to 16e (see FIG. 1).

A transmitter-receiver 64, formed by combining a transmitter and a receiver, is connected to a part of the feeder line 19 of the resistance heater 10 (in FIG. 3, to the lowermost feeder line) through a radiofrequency line 62. Thus, as described above, the resistance heater 10 as a whole can function as the transmitter-receiver antenna 52.

Namely, by radiofrequencies delivered from the transmitter-receiver 64, electric waves for measurement are emitted (transmitted) from the transmitter-receiver antenna 52 to the wafers for temperature measurement 58*a* to 58*e*, and then (second) electric waves are sent back from the elastic wave devices 60*a* to 60*e* disposed on the wafers for temperature measurement 58*a* to 58*e* and are received by the transmitter-receiver antenna 52.

In this embodiment, although a transmitter and a receiver are integrated to provide the transmitter-receiver 64, the transmitter-receiver antenna 52 may be divided into a transmitter antenna and a receiver antenna. In this case, the transmitter-receiver 64 is divided into a transmitter and a receiver.

The elastic wave devices 60*a* to 60*e* are adjusted to respond to frequencies different from each other. Thus, the electric waves for measurement emitted from the transmitter-receiver 64 are sequentially swept within a certain period of time over a certain frequency band so as to cover all the different frequencies for the elastic wave devices 60*a* to 60*e*.

In the radiofrequency line 62, there is disposed a radiofrequency filter part 66 that transmits a radiofrequency component but cuts a low frequency component and a direct-current component. Thus, a heating power from the heating power source 21*a* is prevented from entering the transmitter-receiver 64. A radiofrequency power is formed of a commercial (normal) frequency of 50 or 60 Hz, and the radiofrequency filter part 66 is formed of, e.g., a condenser.

In addition, in each of the feeder lines 19, there is disposed a power filter part 68 that transmits a heating-power component but cuts a radiofrequency component. Thus, a radiofrequency power is prevented from entering the heating power sources 21*a* to 21*e*. The power filter part 68 is formed of, e.g., a coil.

The transmitter-receiver 64 is connected to a temperature analysis part 70. The temperature analysis part 70 is configured to obtain temperatures of the respective wafers for temperature measurement 58*a* to 58*e*, i.e., temperatures of the respective heating zones, based on the electric waves received by the transmitter-receiver antenna 52. Based on the temperatures of the respective heating zones obtained by the temperature analysis part 70, the temperature control part 50 outputs temperature control signals to the respective heating power sources 21*a* to 21*e*, whereby the zone heaters 10*a* to 10*e* can be individually, independently controlled.

The heater thermocouples 17*a* to 17*e* and the inside thermocouples 46*a* to 46*e* are connected to the temperature control part 50 through a thermocouple lines 72 and 74, respectively, so that the temperature control part 50 can make reference to temperature values measured by these thermocouples 17*a* to 17*e* and 46*a* to 46*e*. However, these inside thermocouples 46*a* to 46*e* and/or heater thermocouples 17*a* to 17*e* may be omitted.

Returning to FIG. 1, the overall operation of the thermal processing apparatus 2 as structured above is controlled by a control unit 80 formed of, e.g., a computer. Connected to the control unit 80 is a displaying part 83 such as a general display, on which some useful information, such as the temperatures obtained by the temperature analysis part 70, is displayed.

The control unit 80 controls the temperature control part 50. A program for operations of the control unit 80 is stored in a storage medium 82 such as a flexible disc, a CD (Compact Disc), a hard disc, and a flash memory. Specifically, based on instructions from the control unit 80, start and stop of supply of respective gases, flow rates of the gases, a process temperature, a process pressure and so on are controlled. Further, the storage medium 82 can store an output (temperature) from the temperature analysis part 70.

Next, a thermal processing method performed with the use of the thermal processing apparatus as structured above is described with reference to FIG. 4. FIG. 4 is a flowchart showing an example of the thermal processing method according to the present invention.

Prior to an actual thermal process such as a film deposition process, a correlation between temperatures detected from electric waves sent back from the elastic wave devices 60*a* to 60*e* located correspondingly to the respective heating zones, and powers supplied to the zone heaters 10*a* to 10*e* are previously researched and obtained, and the correlation is stored in the temperature control part 50 of the apparatus. When the thermocouples 17*a* to 17*e* and 46*a* to 46*e* are used, a correlation between temperature values detected by the thermocouples 17*a* to 17*e* and 46*a* to 46*e*, and temperatures obtained from electric waves sent back from the elastic wave devices 60*a* to 60*e* are also researched and obtained.

Then, in an actual thermal process such as a film deposition process for semiconductor wafers W, when the wafers are in an unloaded state and the thermal processing apparatus 2 is in a standby state, the processing vessel 8 is maintained at a process temperature or a temperature lower than the process temperature. Then, a number of wafers W at a normal temperature, which are placed in the wafer boat 22, are loaded into the processing vessel 8 from below, the lid part 28 closes the lower opening of the manifold 18 so as to hermetically seal the inside of the vessel 8. At this time, in addition to the product wafers W, the wafer boat 22 holds the wafers for temperature measurement 58*a* to 58*e*, which are located at positions corresponding to the heating zones 16*a* to 16*e*.

Thereafter, the inside space of the processing vessel 8 is maintained at a predetermined process pressure. Then, heater temperatures and inside temperatures are detected by the respective thermocouples 17*a* to 17*e* and 46*a* to 46*e*. In addition, wafer temperatures are detected by electric waves sent back from the respective elastic wave devices 60*a* to 60*e*. Then, by an operation of the temperature control system shown in FIG. 3, powers to be supplied to the zone heaters 10*a* to 10*e* are increased so that the temperatures of the wafers are increased. After the wafers have been stably maintained at a predetermined process temperature, a predetermined process gas for depositing a film is introduced from the gas nozzle 42 of the gas introduction unit 40.

As described above, after the process gas has been introduced into the inner tube 4 from the respective gas holes 42*a* of the gas nozzle 42, the gas comes into contact with the rotating wafers W in the inner tube 4 so as to induce a film deposition reaction. Then, the gas passes through the ceiling part and flows downward in the space between the inner tuber 4 and the outer tube 6, and the gas is discharged outside the vessel from the outlet port 44. Since the wafer temperatures of the respective heating zones are obtained in real time by the electric waves sent back from the elastic wave devices 60*a* to 60*e*, the temperature control during the process can be performed by a PID control, for example, which controls powers to be supplied to the respective zone heaters 10*a* to 10*e* such that the wafer temperatures achieve (follow) a predetermined target temperature.

With reference to FIGS. 5A and 5B, an operational principle of the elastic wave devices 60*a* to 60*e* is described. FIG. 5A is a view showing an operational principle of an elastic wave device that is a surface elastic wave device. FIG. 5B is a view showing an operational principle of another elastic wave device that is a bulk elastic wave device.

As shown in FIG. 5A, the surface elastic wave device 60A may be formed of a langasite substrate device, as disclosed in JP2000-114920A, JP2003-298383A, and JP2004-140167A. The langasite substrate device has a quadrangular langasite substrate 84 having a piezoelectric function. The dimensions of the langasite substrate 84 are about 10 mm×15 mm×0.5 mm, for example. A pair of electrodes 86a and 86b, each having a shape of teeth of a comb, are formed on a surface of the langasite substrate 84, and a pair of antennae 88a and 88b are disposed on the respective electrodes 86a and 86b.

When a predetermined radiofrequency wave corresponding to a natural frequency of the langasite substrate 84 is emitted as a transmitter signal from a transmitter-receiver 90, a radiofrequency voltage is applied between the electrodes 86a and 86b each having a shape of teeth of a comb. Thus, a surface elastic wave is exited (generated) by the piezoelectric function of the langasite substrate 84. At this time, the dimensions of the langasite substrate 84 are varied depending on a temperature of the langasite substrate 84. Therefore, although the surface elastic wave is propagated on the langasite substrate device, the surface elastic wave is outputted as an electric wave from each of the antennae 88a and 88b after a time period corresponding to the temperature of the substrate 84 has passed.

Then, the transmitter-receiver 90 receives the output electric wave as a receiver signal. By analyzing a time difference Δ between the receiver signal and the transmitter signal, the temperature of the langasite substrate 84 can be obtained. That is to say, the langasite substrate 84 can be used as a wireless temperature detecting device. Such a principle can be applied to the respective elastic wave devices 60a to 60e.

As shown in FIG. 5B, in a case of the bulk elastic wave device 60B typified by an LTGA device, the bulk elastic wave device 60B is used by sandwiching the bulk elastic wave device 60B between a pair of electrodes 94a and 94b connected to a coil 92.

In this case, a predetermined radiofrequency wave corresponding to a natural frequency of the bulk elastic wave device 60B is emitted from the transmitter-receiver 90 as a transmitter signal, while a peripheral frequency range is also swept. Then, an output signal of a resonance frequency corresponding to a temperature of the bulk elastic wave device 60B is outputted from the bulk elastic wave device 60B, and is received by the transmitter-receiver 90. By analyzing the frequency of the output signal (receiver signal), the temperature of the bulk elastic wave device 60B can be detected (obtained). Such a principle can be applied to the respective elastic wave devices 60a to 60e.

A frequency band of each device can be varied by changing a pitch between the electrodes 86a and 86b, a cut thickness and/or a cut angle thereof from a single crystal. Herein, as described above, the elastic wave devices 60a to 60e are set in the frequency bands different from each other. To be specific, in order to prevent an electrical interference, the device 60a is set in a radiofrequency band centered at a first frequency f1, e.g., 10 MHz, the device 60b is set in a radiofrequency band centered at a second frequency f2, e.g., 20 MHz, the device 60c is set in a radiofrequency band centered at a third frequency f3, e.g., 30 MHz, the device 60d is set at a radiofrequency band centered at a fourth frequency f4, e.g., 40 MHz, and the device 60e is set at a radiofrequency band centered at a fifth frequency f5, e.g., 50 MHz.

In addition to the bulk elastic wave device, a boundary elastic wave device can be also applied to the present invention.

In the actual temperature control, a transmitter power is supplied from the transmitter-receiver 64 to the transmitter-receiver antenna 52 formed of the resistance heater 10. Thus, electric waves for temperature measurement corresponding to the natural frequencies of the langasite substrates (when the surface elastic wave devices are used) or the LTGA substrates (when the bulk elastic wave devices are used) are transmitted from the transmitter-receiver antenna 52 (S1). In this case, the frequencies of the electric waves for temperature measurement are swept within a certain period of time over such a frequency band as to sufficiently cover the respective frequencies f1 to f5. In response thereto, in the elastic wave devices 60a to 60e of the respective wafers for temperature measurement 58a to 58e that have received the electric wave for temperature measurement, resonances are generated correspondingly to temperatures of the wafers for temperature measurement 58a to 58e at that time, and the resonance signals are radiated (S2). The principle of generation and output of the electric waves at this time is described above with reference to FIGS. 5A and 5B.

The electric waves generated at this time are received by the transmitter-receiver antenna 52, and are propagated to the transmitter-receiver 64 (S3). By analyzing the electric waves by the temperature analysis part 66, the temperatures of the wafers for temperature measurement 58a to 58e, i.e., the temperatures of the wafers W in the respective heating zones 16a to 16e can be obtained directly and substantially in real time (S4).

Based on the obtained temperatures, the temperature control part 50 individually, independently controls the zone heaters 10a to 10e via the heating power sources 21a to 21e, such that the temperatures of the wafers for temperature measurement 58a to 58e achieve (follow) the target temperature (S5). Namely, by directly measuring and detecting the wafer temperatures (temperatures of the wafers for temperature measurement), a highly precise temperature control can be realized.

The aforementioned series of control operations are repeated until a predetermined process period passes (S6). In this case, the temperature control part 50 preferably controls the heating unit 12 based on any one of an output of the temperature analysis part 70, an output from the temperature measuring unit 17 or 46, and an output from a previously stored thermal model (stored in, e.g., the storage medium 82), or any combination of these outputs.

In this manner, since the resistance heater 10, which is one of structural members of the thermal processing apparatus 2, is caused to function as (also used as) the transmitter-receiver antenna 52, when it is required to obtain temperatures of the wafers 58a to 58e, with the use of the elastic wave devices 60a to 60e formed of langasite substrate devices or LTGA substrate devices, by receiving (second) electric waves sent back from the elastic wave devices 60a to 60e, it is not necessary to additionally install a separate transmitter-receiver antenna. Thus, the temperatures of the wafers for temperature measurement 58a to 58e (these temperatures can be regarded as temperatures of objects to be processed (e.g., semiconductor wafers) W) can be detected with a high precision in a wireless and substantially real time manner, without generating a metal contamination or the like. As a result, a highly precise temperature control can be performed.

Even when the temperatures of objects to be processed W are increased and decreased, a temperature increase speed and a temperature decrease speed can be accurately controlled by this direct temperature measuring method. Namely, a control of temperature increase and temperature decrease can be properly performed. In addition, even when a film adheres to a part of the inner wall surface of the processing vessel 8, the temperatures of the objects to be processed W can be accurately obtained.

Since the resistance heater 10 is also used as the transmitter-receiver antenna 52, there may be concern that a radiofrequency current might enter the respective heating power sources 21a to 21e. However, such concern can be eliminated by the power filter parts 68 that are disposed in the respective feeder lines 19 connected to the transmitter-receiver antenna 52. That is, since each of the power filter parts 68 cuts the radiofrequency current, the radiofrequency current is prevented from entering the respective heating power sources 21a to 21e.

On the contrary, since the radiofrequency line 62 is connected to the feeder line 19, there may be concern that a heating power of the heating power source 21a might flow into the transmitter-receiver 64. However, such concern can be eliminated by the radiofrequency filter part 66 disposed in the radiofrequency line 62. That is, since the radiofrequency filter part 66 cuts the heating power of a commercial (low) frequency and a direct-current component, the heating power is prevented from entering the transmitter-receiver 64.

In the actual temperature control, in order to perform a more precise control, it is preferable that the temperatures are controlled by referring not only to the temperatures obtained by the temperature analysis part 70 but also to values measured by the heater thermocouples 17a to 17e and/or values measured by the inside thermocouples 46a to 46e.

Since the heater thermocouples 17a to 17e and/or the inside thermocouples 46a to 46e are provided, even when the processing vessel 8 is in an idling operation, i.e., wafers are unloaded therefrom so that the processing vessel 8 is vacant, the processing vessel 8 can be suitably preheated to an adequate temperature.

Second Embodiment

Figure 6:
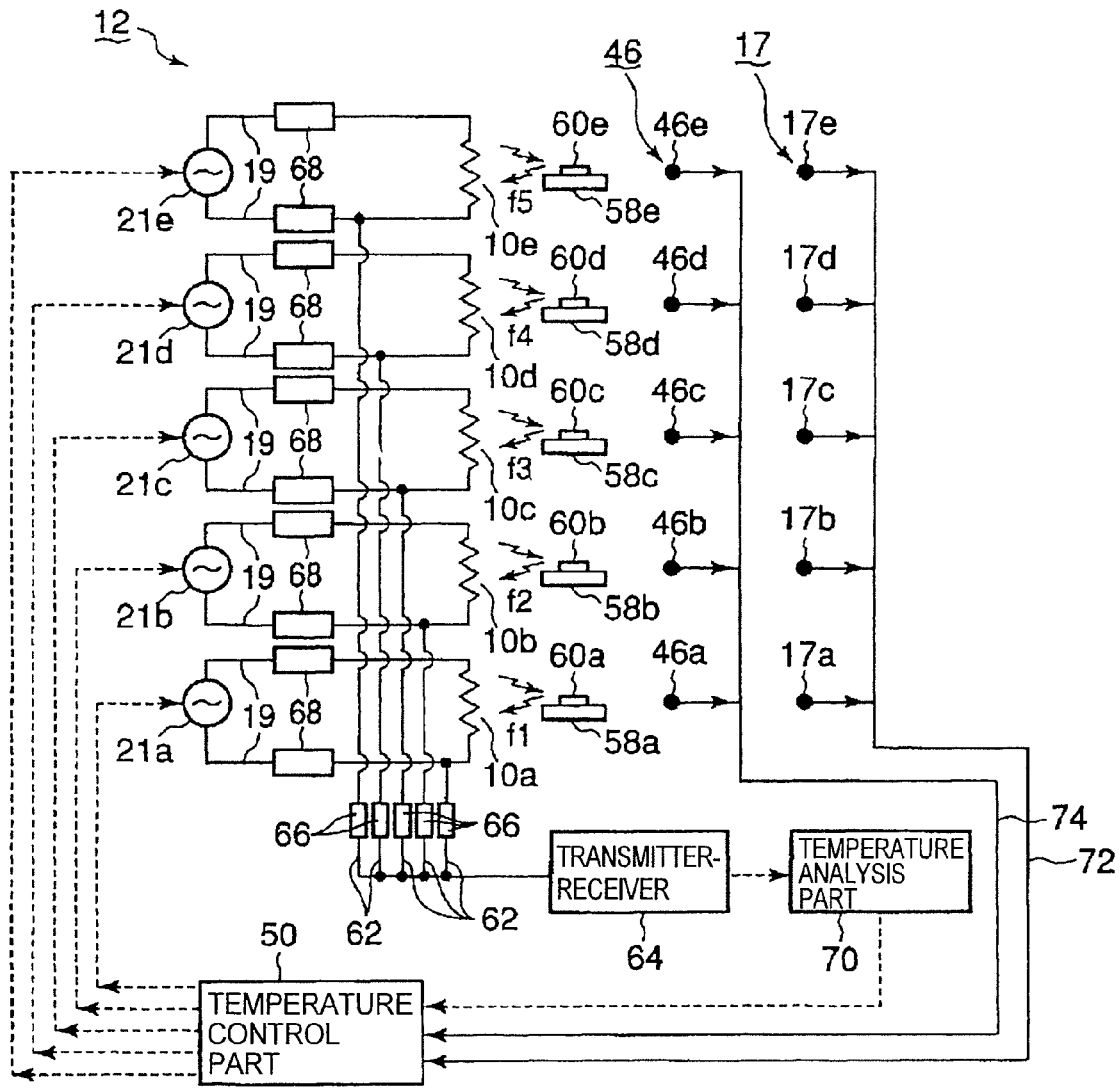
FIG. 6 is a system view of a temperature control system of a second embodiment of the thermal processing apparatus according to the present invention.

Next, a second embodiment of the thermal processing apparatus according to the present invention is described. FIG. 6 is a system view of a temperature control system of a second embodiment of the thermal processing apparatus according to the present invention. Herein, structural members which are the same as the structural members shown in FIGS. 1 to 5 are shown by the same reference numbers, and detailed description thereof is omitted.

In the above first embodiment, regarding the resistance heater 10 of the heating unit 12, the adjacent zone heaters 10a to 10e are in a conductive state by an electrical connection therebetween. However, as shown in FIG. 6, in this embodiment, zone heaters 10a to 10e are divided from each other, so that the adjacent zone heaters 10a to 10e are in an electrically insulated state for the respective heating powers. In this heating unit, opposed ends of the respective zone heaters 10a to 10e are connected to corresponding heating power sources 21a to 21e through two feeder lines 19.

A radiofrequency line 62 extended from a transmitter-receiver 64 is divided into branch lines, and the respective branch lines are connected to the feeder lines 19 connected to the respective zone heaters 10a to 10e in parallel. Thus, the zone heaters 10a to 10e as a whole can function as a transmitter-receiver antenna 52. Radiofrequency filter parts 66 are disposed in the branched lines of the radiofrequency line 62. Due to the radiofrequency filter part 66, a radiofrequency power of an electric wave for measurement can be transmitted, but a heating power can be cut. Thus, the heating power is prevented from entering the transmitter-receiver 64.

In addition, a power filter part 68 is disposed in each of the feeder lines 19. Due to the power filter part 68, a heating power can be transmitted, but the radiofrequency power of an electric wave for measurement can be prevented from entering the respective power sources 21a to 21e.

Also in this embodiment, since the resistance heater 10 is caused to function as (also used as) the transmitter-receiver antenna 52, when the radiofrequency powers of the electric waves for measurement are supplied from the transmitter-receiver 64 to the respective zone heaters 10a to 10e through the respective radiofrequency branched lines 62, the electric waves for measurement are emitted from the zone heaters 10a to 10e (resistance heater 10), and (second) electric waves dependent on the temperatures of the wafers 58a to 58e are radiated (sent back) from the corresponding elastic wave devices 60a to 60e. Thus, the second embodiment can exert the same effect as that of the first embodiment. Namely, when it is required to obtain temperatures of the wafers 58a to 58e by receiving the (second) electric waves transmitted from the elastic wave devices 60a to 60e, it is not necessary to additionally install a transmitter-receiver antenna. Thus, the temperatures of the wafers for temperature measurement 58a to 58e (these temperatures can be regarded as temperatures of objects to be processed W) can be accurately detected with a high precision in a wireless and substantially real time manner, without generating a metal contamination or the like. As a result, a highly precise temperature control can be performed.

Third Embodiment to Sixth Embodiment

Next, third to sixth embodiments of the thermal processing apparatus according to the present invention are described. Although the resistance heater 10, which is one of the structural members of the thermal processing apparatus, is used as the transmitter-receiver antenna 52 in the first and second embodiments, the present invention is not limited to this manner. In the third to sixth embodiments, other structural members of the thermal processing apparatus, e.g., the wafer boat 22 as a holding unit (third embodiment), the gas nozzle 42 of the gas introduction unit 40 (fourth embodiment), and the temperature measuring units 17 and 46 formed of the thermocouples (fifth embodiment and sixth embodiment) are also used as a transmitter-receiver antenna.

Figure 7:
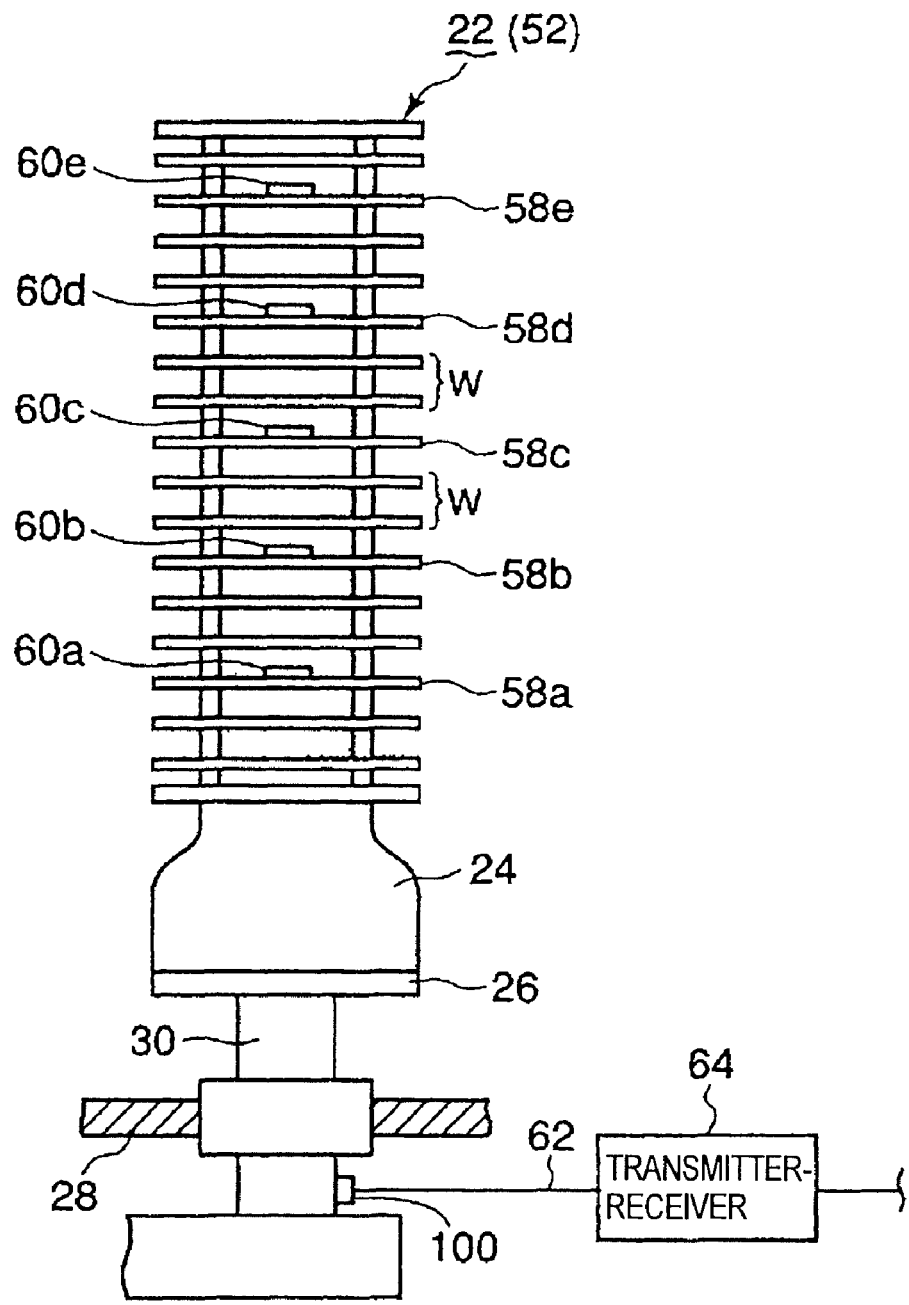
FIG. 7 is a view showing a third embodiment of the thermal processing apparatus according to the present invention, in which a wafer boat is caused to function as (also used as) a transmitter-receiver antenna.
Figure 8:
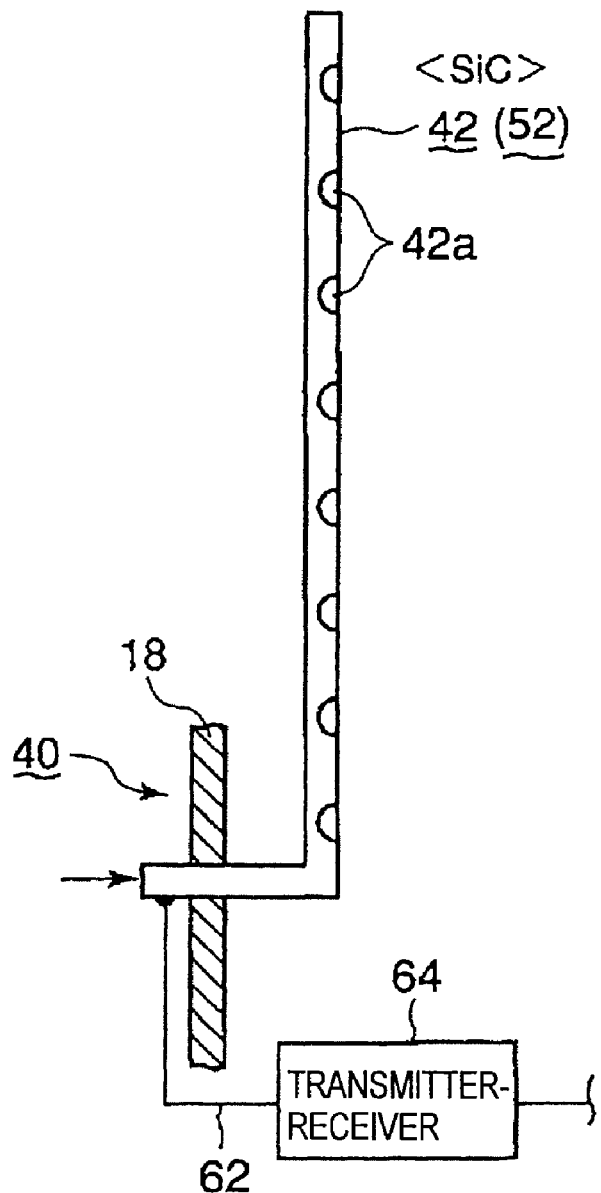
FIG. 8 is a view showing a fourth embodiment of the thermal processing apparatus according to the present invention, in which a gas nozzle of a gas introduction unit is caused to function as (also used as) a transmitter-receiver antenna.
Figure 9:
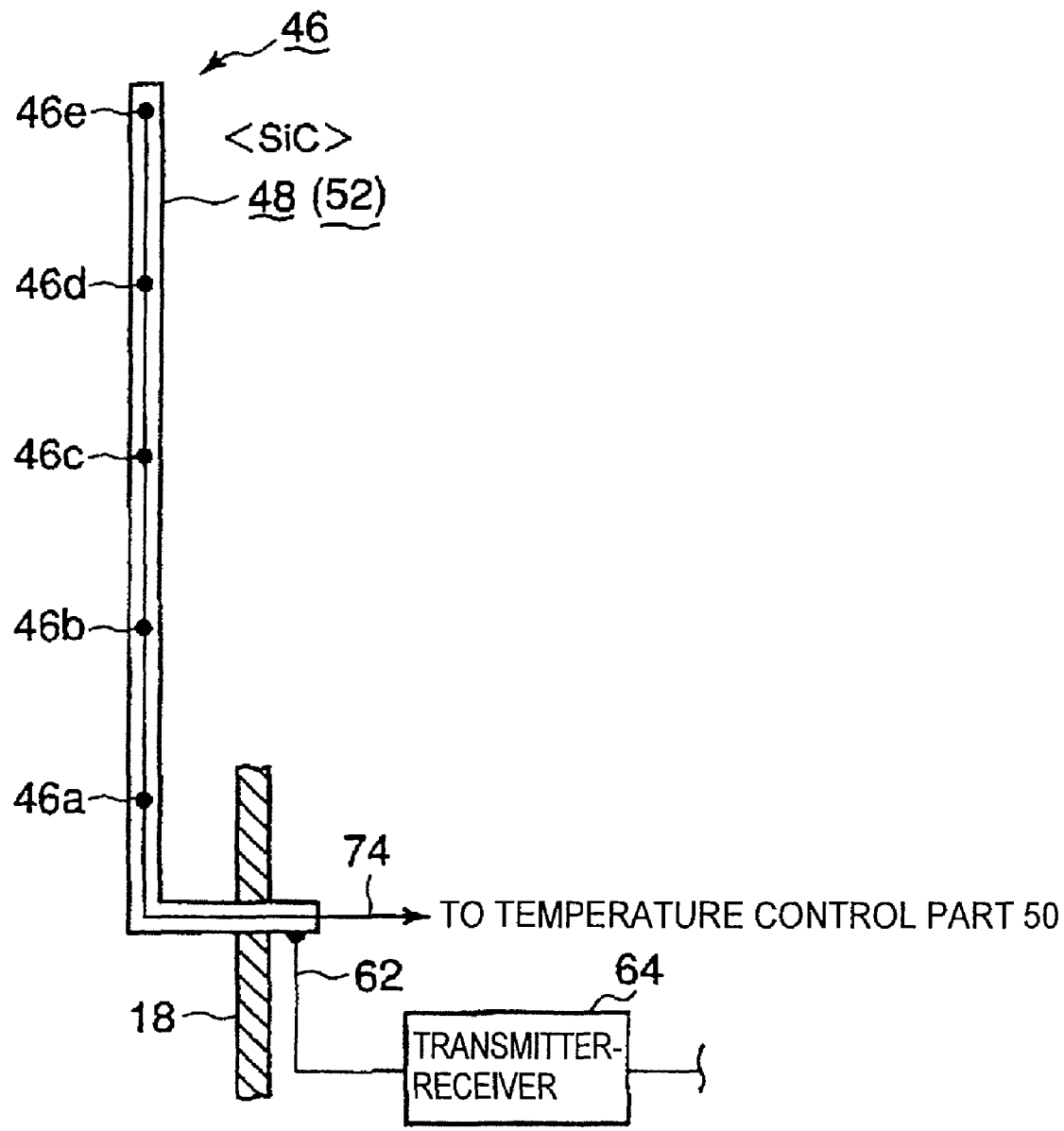
FIG. 9 is a view showing a fifth embodiment of the thermal processing apparatus according to the present invention, in which a protective tube of a thermocouple is caused to function as (also used as) a transmitter-receiver antenna.
Figure 10:
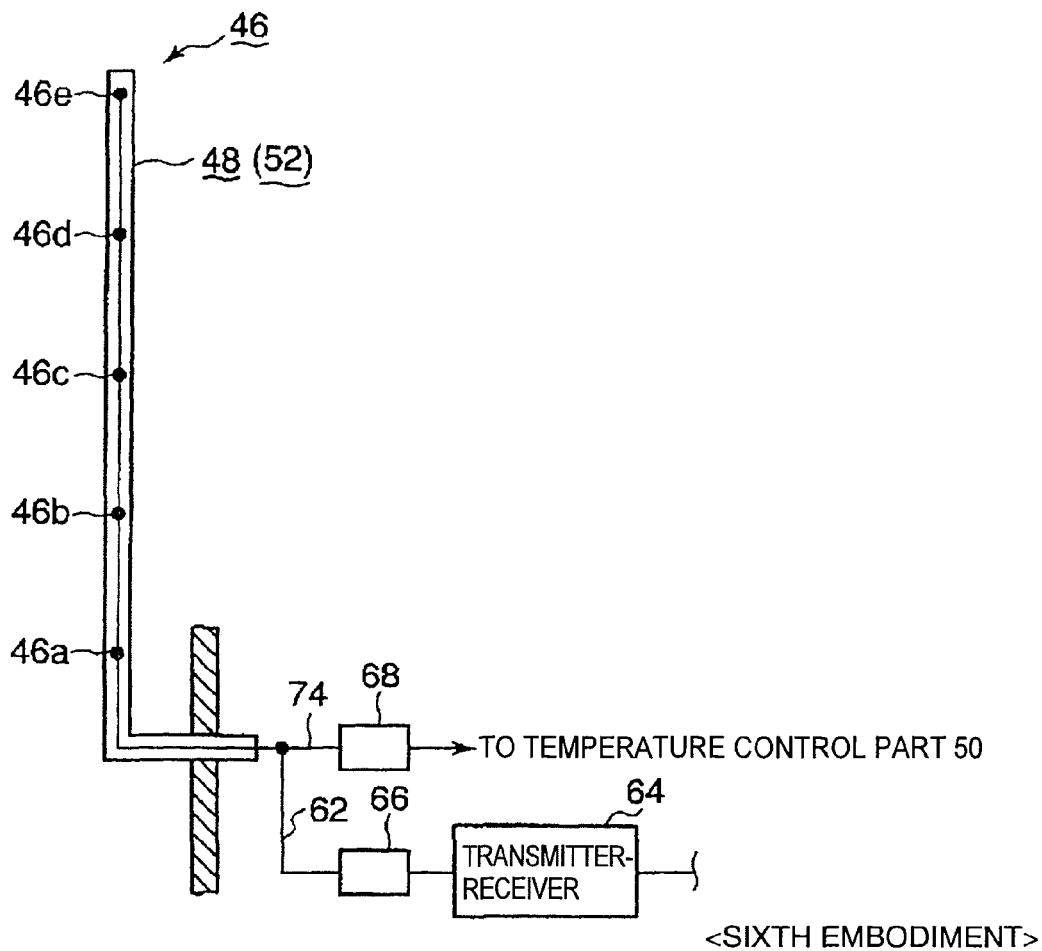
FIG. 10 is a view showing a sixth embodiment of the thermal processing apparatus according to the present invention, in which a thermocouple is caused to function as (also used as) a transmitter-receiver antenna.

FIG. 7 is a view showing a third embodiment of the thermal processing apparatus according to the present invention, in which a wafer boat is caused to function as (also used as) a transmitter-receiver antenna. FIG. 8 is a view showing a fourth embodiment of the thermal processing apparatus according to the present invention, in which a gas nozzle of a gas introduction unit is caused to function as (also used as) a transmitter-receiver antenna. FIG. 9 is a view showing a fifth embodiment of the thermal processing apparatus according to the present invention, in which a protective tube of a thermocouple is caused to function as (also used as) a transmitter-receiver antenna. FIG. 10 is a view showing a sixth embodiment of the thermal processing apparatus according to the present invention, in which a thermocouple is caused to function as (also used as) a transmitter-receiver antenna.

Herein, structural members which are the same as the structural members shown in FIGS. 1 to 5 are shown by the same reference numbers, and detailed description thereof is omitted.

As shown in FIG. 7, in the third embodiment, the wafer boat 22 as a holding unit functions as the transmitter-receiver antenna 52. Although a wafer boat is generally made of quartz that is an insulation material, the wafer boat 22 in this embodiment is made of a conductive material so as not to contaminate a semiconductor wafer W. As such a conductive material, it is preferable to use a semiconducting material. For example, the semiconducting material is one material that is selected from a group consisting of polysilicon, single crystal silicon, SiC, SiGe, GaN, ZnO, AlN, and GaAs.

In this case, the heat-retention tube 24 and the rotational table 26 are also made of a conductive material such as SiC. A slip ring 100 disposed on a distal end of the radiofrequency line 62 extended from the transmitter-receiver 64 is electrically connected to the rotational shaft 30 made of a conductive material such as stainless steel. Thus, a radiofrequency power of an electric wave for measurement is supplied to the wafer boat 22, so that the wafer boat 22 as a whole can function as the transmitter-receiver antenna 52.

The third embodiment can exert the same effect as that of the first embodiment. Namely, when it is required to obtain temperatures of the wafers 58a to 58e with the use of the elastic wave devices 60a to 60e, it is not necessary to additionally install a transmitter-receiver antenna. Thus, the temperatures of the wafers for temperature measurement 58a to 58e (these temperatures can be regarded as temperatures of objects to be processed W) can be accurately detected with a high precision in a wireless and substantially real time manner, without generating a metal contamination or the like. As a result, a highly precise temperature control can be performed.

As shown in FIG. 8, in the fourth embodiment, the gas nozzle 42, which is a part of the gas introduction unit 40, functions as the transmitter-receiver antenna 52. Although a gas nozzle is generally made of quartz that is an insulation material, the gas nozzle 42 in this embodiment is made of a conductive material so as not to contaminate a semiconductor wafer W. As such a conductive material, it is preferable to use a semiconducting material. For example, the semiconducting material is one material that is selected from a group consisting of polysilicon, single crystal silicon, SiC, SiGe, GaN, ZnO, AlN, and GaAs.

In this embodiment, the radiofrequency line 62 extended from the transmitter-receiver 64 is electrically connected to a proximal end of the gas nozzle 42 made of the conductive material. Thus, a radiofrequency power of an electric wave for measurement is supplied to the gas nozzle 42, so that the gas nozzle 42 as a whole can function as the transmitter-receiver antenna 52.

The fourth embodiment can exert the same effect as that of the first embodiment. Namely, when it is required to obtain temperatures of the wafers 58a to 58e with the use of the elastic wave devices 60a to 60e, it is not necessary to additionally install a transmitter-receiver antenna. Thus, the temperatures of the wafers for temperature measurement 58a to 58e (these temperatures can be regarded as temperatures of objects to be processed W) can be accurately detected with a high precision in a wireless and substantially real time manner, without generating a metal contamination or the like. As a result, a highly precise temperature control can be performed.

As shown in FIG. 9, in the fifth embodiment, the protective tube 48, which is a part of the second temperature measuring unit 46, functions as the transmitter-receiver antenna 52. Although a protective tube for accommodating the thermocouples 46a to 46e is generally made of quartz that is an insulation material, the protective tube 48 in this embodiment is made of a conductive material so as not to contaminate a semiconductor wafer W. As such a conductive material, it is preferable to use a semiconducting material. For example, the semiconducting material is one material that is selected from a group consisting of polysilicon, single crystal silicon, SiC, SiGe, GaN, ZnO, AlN, and GaAs.

The radiofrequency line 62 extended from the transmitter-receiver 64 is electrically connected to a proximal end of the protective tube 48 made of the conductive material. Thus, a radiofrequency power of an electric wave for measurement is supplied to the protective tube 48, so that the protective tube 48 as a whole can function as the transmitter-receiver antenna 52.

The fifth embodiment can exert the same effect as that of the first embodiment. Namely, when it is required to obtain temperatures of the wafers 58a to 58e with the use of the elastic wave devices 60a to 60e, it is not necessary to additionally install a transmitter-receiver antenna. Thus, the temperatures of the wafers for temperature measurement 58a to 58e (these temperatures can be regarded as temperatures of objects to be processed W) can be accurately detected with a high precision in a wireless and substantially real time manner, without generating a metal contamination or the like. As a result, a highly precise temperature control can be performed.

As shown in FIG. 10, in the sixth embodiment, the thermocouples 46a to 46e, which are parts of the second temperature measuring unit 46, function as the transmitter-receiver antenna 52. Since the thermocouples 46a to 46e are generally made of a conductive material, the thermocouples 46a to 46e can function as the transmitter-receiver antenna 52 without any special conditions.

The radiofrequency line 62 extended from the transmitter-receiver 64 is electrically connected to the thermocouple line 74. Further, in the radiofrequency line 62 is disposed the radiofrequency filter part 66 that transmits a radiofrequency power but cuts direct-current components for the thermocouples. Furthermore, in the thermocouple line 74 is disposed the power filter part 68 that transmits a direct-current component but cuts a radiofrequency power. Thus, a radiofrequency power of an electric wave for measurement is supplied to the thermocouples 46a to 46e, so that the thermocouples 46a to 46e as a whole can function as the transmitter-receiver antenna 52.

The sixth embodiment can exert the same effect as that of the first embodiment. Namely, when it is required to obtain temperatures of the wafers 58a to 58e with the use of the elastic wave devices 60a to 60e, it is not necessary to additionally install a transmitter-receiver antenna. Thus, the temperatures of the wafers for temperature measurement 58a to 58e (these temperatures can be regarded as temperatures of objects to be processed W) can be accurately detected with a high precision in a wireless and substantially real time manner, without generating a metal contamination or the like. As a result, a highly precise temperature control can be performed.

Alternatively, instead of the thermocouples 46a to 46e, the thermocouples 17a to 17e of the first temperature measuring unit 17 may be caused to function as the transmitter-receiver antenna 52.

In the thermal processing apparatus, the processing vessel 8 may be provided with a plasma generating unit configured to generate a plasma by a radiofrequency power so as to assist a thermal process to a wafer (see, for example, JP2006-270016A). In this case, in order to prevent generation of noise, the frequency bands of electric waves for temperature measurement are preferably set differently from a frequency of a radiofrequency power for the plasma generation, e.g., 13.56 MHz and 400 kHz.

In the thermal processing apparatus equipped with the plasma generation unit, there is a possibility that noises might be generated by the plasma or that noises might be generated in accordance with a power control for the heating power sources 21a to 21e. In order to prevent that the temperature measurement is affected by these noises, it is preferable to control the supply of powers such that a power to be supplied to the heating unit 12 and/or a power for the plasma generation, and a power of an electric wave for temperature measurement to be outputted from the transmitter-receiver (transmitter) 64 are periodically divided.

Figure 11:
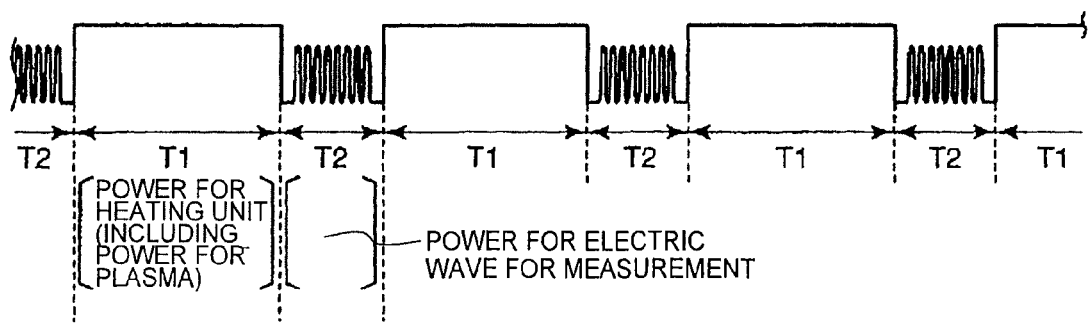
FIG. 11 is a view showing an example of a timing chart of a power supplied to a heating unit (including a power for plasma formation) and a power of an electric wave for measurement.

FIG. 11 is a view showing an example of a timing chart of a power supplied to a heating unit (including a power for plasma formation) and a power of an electric wave for measurement. In the example shown in FIG. 11, the periodically divisional control is performed such that a time period T1 in which a power (including a power for the plasma generation) is supplied to the heating unit 12 (see FIG. 1), and a time period T2 in which a power of an electric wave for temperature measurement is supplied, are alternately repeated. Such a periodically divisional control is realized by the control unit 80 (see FIG. 1) that controls both the control part 50 and the transmitter-receiver 64.

The durations of the time period T1 and the time period T2 are suitably selected depending on wattage of the powers to be used. Owing to the periodically divisional control, mixing of noises during a temperature measurement can be reliably prevented. Thus, the wafer temperatures can be more precisely detected.

In the above embodiments, although one of the structural members of the thermal processing apparatus is used as the transmitter-receiver antenna 52, the present invention is not limited thereto. Namely, any of the two structural members among the aforementioned structural members may be combined with each other. For example, the resistance heater 10 may be used as a transmitter antenna, and the gas nozzle 42 may be used as a receiver antenna.

Further, in the above embodiments, although each of the wafers for temperature measurement 58a to 58e is provided with one elastic wave device, the present invention is not limited thereto. For example, a plurality of elastic wave devices may be provided on one wafer for temperature measurement.

Figure 12A:
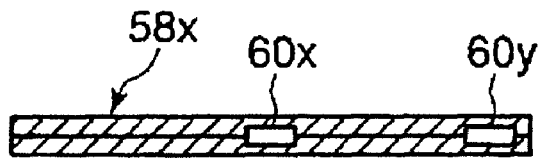
FIGS. 12A and 12B are views showing modifications of a wafer for temperature measurement.
Figure 12B:
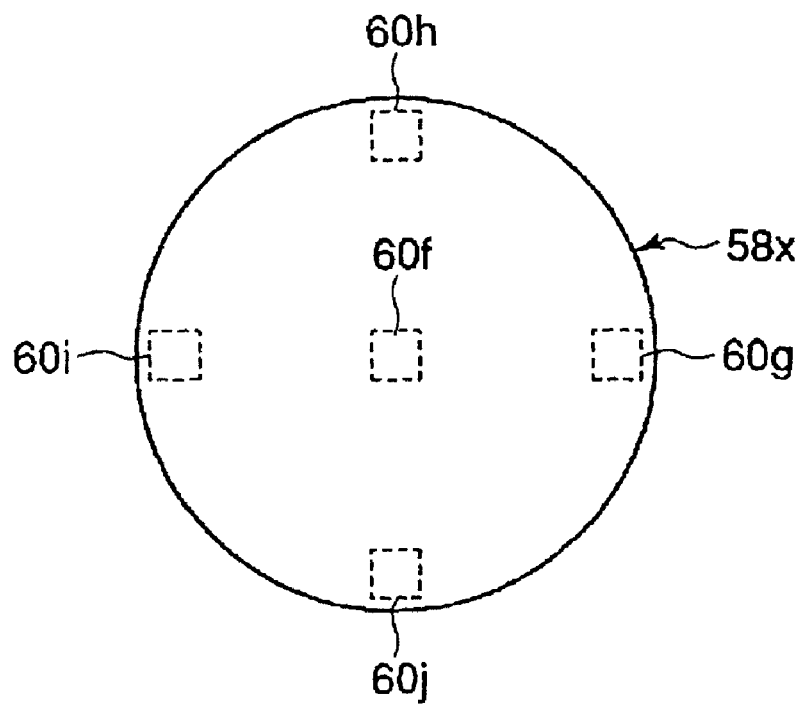

FIGS. 12A and 12B are views showing modifications of a wafer for temperature measurement. More specifically, FIG. 12A is a sectional view showing a first modification, and FIG. 12B is a plan view showing a second modification.

In the first modification shown in FIG. 12A, a wafer for temperature measurement 58x is vertically divided into two. After two elastic wave devices 60x and 60y have been embedded therebetween at a central portion thereof and at a peripheral portion thereof, the divided wafers are joined to each other.

At this time, since the two elastic wave devices 60x and 60y are embedded in the wafer for temperature measurement 58x, generation of contamination, which might be caused by the elastic wave devices 60x and 60y, can be perfectly prevented. In addition, when the two elastic wave devices 60x and 60y are embedded in the one wafer for temperature measurement 58x, it is preferable that frequency bands of the elastic wave devices 60x and 60y are set differently from each other, in order to prevent an electrical interference therebetween.

On the other hand, in the second modification shown in FIG. 12B, a plurality of, specifically, five elastic wave devices 60f, 60g, 60h, 60i, and 60j are disposed at a central portion and at four peripheral portions on a surface of a wafer for temperature measurement 58x. Due to this arrangement, an in-plane distribution of a temperature of the wafer can be measured. In this case, it is preferable that frequency bands of these elastic wave devices 60f, 60g, 60h, 60i, and 60j are set differently from each other, in order to prevent an electrical interference therebetween.

Alternatively, these plural elastic wave devices 60f, 60g, 60h, 60i, and 60j may be partially or fully embedded in the wafer for temperature measurement 58x.

In general, depending on a type of film deposition process, it may be preferable that a temperature inclination (gradient) is positively formed in a plane of a wafer, while the process is performed or while the temperature is increased or decreased. In this case, when the elastic wave devices 60f to 60j, 60x and 60y are disposed on or in the central portion and the peripheral portions of the wafer for temperature measurement 58x, as described above, the temperature can be controlled such that a proper and accurate temperature inclination is formed in the plane of the wafer.

It is preferable that wafers for temperature measurement, which are spare wafers for the wafers for temperature measurement 58a to 58e and 58x, are prepared in advance in the apparatus, so that the wafers can be automatically replaced periodically or according to need, for example, when the wafers are deteriorated.

In the above embodiments, although the processing vessel 8 of a dual-tube structure including the inner tube 4 and the outer tube 6 is taken by way of example, the present invention is not limited thereto. The present invention can be applied to a processing vessel of a single-tube structure. In addition, the processing vessel 8 is not limited to a vertical type of processing vessel. The present invention can be applied to a horizontal type of processing vessel.

Moreover, although a film deposition process is taken as an example of a thermal process, the present invention is not limited thereto. The present invention can be applied to an oxidation and diffusion process, an annealing process, an etching process, a modification process, and a plasma process using a plasma. When a plasma is used, in order to prevent generation of noise, it is preferable that a frequency of a radiofrequency power for plasma generation and frequency bands of electric waves for temperature measurement differ from each other.

In addition, as an elastic wave device, there may be used a substrate device made of one material that is selected from the group consisting of lanthanum tantalic acid gallium aluminium (LTGA), quartz ($SiO_2$), zinc oxide (ZnO), Rochelle salt (sodium potassium tartrate: $KNaC_4H_4O_5$), lead zirconate titanate (PZT: $pb(Zr, Ti)O_2$), lithium niobate ($LiNbO_3$), lithium tantalum acid ($LiTaO_3$), lithium tetraborate ($Li_2B_4O_7$), langasite ($La_2Ga_5SiO_{14}$), aluminium nitride, tourmaline, and poly vinylidene fluoride (PVDF). In addition, a boundary elastic wave device made of a combination of materials among the aforementioned materials may be applied to the present invention.

In addition, a semiconductor wafer is taken as an example of an object to be processed, the present invention is not limited thereto. The object to be processed may be a glass substrate, an LCD substrate, a ceramic substrate, and a photovoltaic substrate.

The invention claimed is:
1. A thermal processing apparatus comprising:
a processing vessel capable of being evacuated, the processing vessel also being capable of accommodating, in addition to a plurality of objects to be processed, an object for temperature measurement equipped with an acoustic wave device;

a holding unit configured to be loaded into and unloaded from the processing vessel, while holding the plurality of objects to be processed and the object for temperature measurement;

a gas introduction unit configured to introduce a gas into the processing vessel;

a heating unit configured to heat the plurality of objects to be processed and the object for temperature measurement that are accommodated in the processing vessel;

a first conductive member configured to function as a transmitter antenna connected to a transmitter through a radiofrequency line, for transmitting an electromagnetic wave for measurement toward the acoustic wave device accommodated in the processing vessel;

a second conductive member configured to function as a receiver antenna connected to a receiver through a radiofrequency line, for receiving an electromagnetic wave dependent on a temperature of the acoustic wave device which is emitted from the acoustic wave device accommodated in the processing vessel;

a temperature analysis part configured to obtain a temperature of the object for temperature measurement based on the electromagnetic wave received by the receiver antenna; and a temperature control part configured to control the heating unit;

wherein:

the first conductive member is disposed as a part of a thermal processing part in the processing vessel;

the second conductive member is disposed as a part of a thermal processing part in the processing vessel; and the radiofrequency line is provided with a radiofrequency filter part that transmits a radiofrequency component but cuts a low frequency component and a direct-current component.

2. The thermal processing apparatus according to claim 1, wherein the heating unit includes a heating power source and a resistance heater connected to the heating power source through a feeder line.

3. The thermal processing apparatus according to claim 2, wherein the resistance heater is divided into a plurality of zone heaters to which powers can be individually, controllably supplied, in order to separate an inside space of the processing vessel into a plurality of heating zones.

4. The thermal processing apparatus according to claim 3, wherein each adjacent two zone heaters are in an electrically communicating state, and a feeder line is connected to each of the zone heaters.

5. The thermal processing apparatus according to claim 3, wherein each adjacent two zone heaters are in an electrically non-communicating state, and a feeder line is connected to each of the zone heaters.

6. The thermal processing apparatus according to claim 2, wherein the first conductive member and/or the second conductive member are/is the resistance heater.

7. The thermal processing apparatus according to claim 2, wherein the feeder line is provided with a power filter part that transmits a heating-power component but cuts a radiofrequency component.

8. The thermal processing apparatus according to claim 7, wherein the temperature control part is configured to alternate delivery of power, in a periodic fashion, between a heating power to be supplied to the resistance heater and a power for an electromagnetic wave to be emitted from the transmitter.

9. The thermal processing apparatus according to claim 1, wherein:

the holding unit is made of a conductive material; and the first conductive member and/or the second conductive member are/is the holding unit.

10. The thermal processing apparatus according to claim 1, wherein:

the gas introduction unit is made of a conductive material; and the first conductive member and/or the second conductive member are/is the gas introduction unit.

11. The thermal processing apparatus according to claim 9, wherein the first conductive member and/or the second conductive member are/is made of a semiconducting material.

12. The thermal processing apparatus according to claim 11, wherein:

the semiconducting material is one material that is selected from a group consisting of polysilicon, single crystal silicon, SiC, SiGe, GaN, ZnO, AlN, and GaAs.

13. The thermal processing apparatus according to claim 1, wherein:

a plurality of acoustic wave devices are disposed on the object for temperature measurement; and frequency bands of the acoustic wave devices are set differently from each other.

14. The thermal processing apparatus according to claim 13, wherein the acoustic wave devices are disposed on the object for temperature measurement at least at a central portion thereof and at a peripheral portion thereof.

15. The thermal processing apparatus according to claim 3, wherein the object for temperature measurement comprises a plurality of objects for temperature measurement that are arranged correspondingly to the respective heating zones.

16. The thermal processing apparatus according to claim 15, wherein frequency bands of the acoustic wave devices of the objects for temperature measurement are set differently from each other for the respective heating zones.

17. The thermal processing apparatus according to claim 1, wherein the first conductive member and the second conductive member are integrated to each other, so that a function of the transmitter antenna and a function of the receiver antenna are integrated to each other as a function of a transmitter-receiver antenna.

18. The thermal processing apparatus according to claim 1, wherein:

the processing vessel is provided with a plasma generating unit configured to generate a plasma by a radiofrequency power so as to assist a thermal process to the objects to be processed; and a frequency band of the electromagnetic wave for measurement is set differently from a frequency of the radiofrequency power.

19. The thermal processing apparatus according to claim 1, wherein:
the processing vessel is provided with a plasma generating unit configured to generate a plasma by a radiofrequency power so as to assist a thermal process to the objects to be processed; and
when the electromagnetic wave for measurement is transmitted and received, generation of plasma is temporarily suspended.

20. The thermal processing apparatus according to claim 1, wherein
the acoustic wave device is selected from a surface acoustic wave device, a bulk acoustic wave device, and a boundary acoustic wave device.

21. The thermal processing apparatus according to claim 1, wherein
the acoustic wave device is a substrate device made of one material that is selected from a group consisting of lanthanum tantalic acid gallium aluminium (LTGA), quartz ($SiO_2$), zinc oxide (ZnO), Rochelle salt (sodium potassium tartrate: $KNaC_4H_4O_5$), lead zirconate titanate (PZT: $pb(Zr, Ti)O_3$), lithium niobate ($LiNbO_3$), lithium tantalum acid ($LiTaO_3$), lithium tetraborate ($Li_2B_4O_7$), langasite ($La_3Ga_5SiO_{14}$), aluminium nitride, tourmaline, and poly vinylidene fluoride (PVDF).

22. The thermal processing apparatus according to claim 1, wherein
the temperature control part controls the heating unit based on one of an output from the temperature analysis part, an output from the temperature measuring unit, and an output from a previously stored thermal model, or a combination thereof.

23. The thermal processing apparatus according to claim 1, further comprising
a storage part configured to store an output from the temperature analysis part.

24. The thermal processing apparatus according to claim 1, further comprising
a displaying part configured to display an output from the temperature analysis part.

25. A thermal processing apparatus comprising:
a processing vessel capable of being evacuated, the processing vessel also being capable of accommodating, in addition to a plurality of objects to be processed, an object for temperature measurement equipped with an acoustic wave device;
a holding unit configured to be loaded into and unloaded from the processing vessel, while holding the plurality of objects to be processed and the object for temperature measurement;
a gas introduction unit configured to introduce a gas into the processing vessel;
a heating unit configured to heat the plurality of objects to be processed and the object for temperature measurement that are accommodated in the processing vessel;
a first conductive member configured to function as a transmitter antenna connected to a transmitter through a radiofrequency line, for transmitting an electromagnetic wave for measurement toward the acoustic wave device accommodated in the processing vessel;
a second conductive member configured to function as a receiver antenna connected to a receiver through a radiofrequency line, for receiving an electromagnetic wave dependent on a temperature of the acoustic wave device which is emitted from the acoustic wave device accommodated in the processing vessel;
a temperature analysis part configured to obtain a temperature of the object for temperature measurement based on the electromagnetic wave received by the receiver antenna;
a temperature control part configured to control the heating unit; and
a temperature measuring unit disposed in the processing vessel and/or on the heating unit;
wherein:
the first conductive member is disposed as a part of the temperature measuring unit;
the second conductive member is disposed as a part of the temperature measuring unit; and
the radiofrequency line is provided with a radiofrequency filter part that transmits a radiofrequency component but cuts a low frequency component and a direct-current component.

26. The thermal processing apparatus according to claim 25, wherein
the heating unit includes a heating power source and a resistance heater connected to the heating power source through a feeder line.

27. The thermal processing apparatus according to claim 26, wherein
the resistance heater is divided into a plurality of zone heaters to which powers can be individually, controllably supplied, in order to separate an inside space of the processing vessel into a plurality of heating zones.

28. The thermal processing apparatus according to claim 27, wherein
each adjacent two zone heaters are in an electrically communicating state, and a feeder line is connected to each of the zone heaters.

29. The thermal processing apparatus according to claim 27, wherein
each adjacent two zone heaters are in an electrically non-communicating state, and a feeder line is connected to each of the zone heaters.

30. The thermal processing apparatus according to claim 26, wherein
the feeder line is provided with a power filter part that transmits a heating-power component but cuts a radiofrequency component.

31. The thermal processing apparatus according to claim 25, wherein:
the temperature measuring unit includes a thermocouple; and
the first conductive member and/or the second conductive member are/is the thermocouple.

32. The thermal processing apparatus according to claim 31, wherein
a thermocouple line connected to the thermocouple is provided with a direct-current filter part that transmits a direct-current component but cuts a radiofrequency component.

33. The thermal processing apparatus according to claim 31, wherein:
the temperature measuring unit includes a protective tube made of a conductive material, for accommodating the thermocouple to protect the same; and
the first conductive member and/or the second conductive member are/is the protective tube.

34. The thermal processing apparatus according to claim 33, wherein
the first conductive member and/or the second conductive member are made of a semiconducting material.

35. The thermal processing apparatus according to claim 34, wherein
the semiconducting material is one material that is selected from a group consisting of polysilicon, single crystal silicon, SiC, SiGe, GaN, ZnO, AlN, and GaAs.

36. A thermal processing method for an object to be processed in which a holding unit holding an object for temperature measurement equipped with an acoustic wave device and a plurality of objects to be processed is loaded into a processing vessel, and the objects to be processed are heated by a heating unit so as to be thermally processed, the thermal processing method comprising:
transmitting an electromagnetic wave for measurement from a transmitter antenna disposed on the processing vessel to the object for temperature measurement;
receiving an electromagnetic wave emitted by the acoustic wave device of the object for temperature measurement after the acoustic wave device has received the electromagnetic wave for measurement, by a receiver antenna disposed on the processing vessel;
obtaining a temperature of the object for temperature measurement based on the electromagnetic wave received by the receiver antenna; and
controlling the heating unit based on the obtained temperature;
wherein, the step of transmitting includes filtering the electromagnetic wave to transmit a radiofrequency component, but to cut a low frequency component and a direct-current component.

37. The thermal processing method according to claim 36, wherein:
an inside space of the processing vessel is divided into a plurality of heating zones;
the object for temperature measurement comprises a plurality of objects for temperature measurement that are arranged correspondingly to the respective heating zones; and
frequency bands of the acoustic wave devices of the objects for temperature measurement are set differently from each other.

38. The thermal processing method according to claim 36, wherein:
a thermocouple for temperature measurement is disposed in the processing vessel and/or on the heating unit;
when the heating unit is controlled, the heating unit is controlled by referring not only to the measured temperature of the object for temperature measurement but also to a temperature value measured by the thermocouple.

39. The thermal processing method according to claim 36, further comprising processing the objects to be processed by a plasma generated by a radiofrequency power so as to assist the thermal process to the objects to be processed,
wherein a frequency band of the electromagnetic wave for measurement is set differently from a frequency of the radiofrequency power.

40. A storage medium storing a computer program executable on a computer, wherein
the computer program incorporates steps for performing the thermal processing method according to claim 36.

* * * * *